(12) United States Patent
Koyama et al.

(10) Patent No.: US 7,375,668 B2
(45) Date of Patent: *May 20, 2008

(54) DIGITAL DRIVER AND DISPLAY DEVICE

(75) Inventors: Jun Koyama, Kanagawa (JP); Yutaka Shionoiri, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/717,026

(22) Filed: Mar. 13, 2007

(65) Prior Publication Data

US 2007/0205935 A1 Sep. 6, 2007

Related U.S. Application Data

(62) Division of application No. 11/311,167, filed on Dec. 20, 2005, now Pat. No. 7,190,297, which is a division of application No. 10/926,956, filed on Aug. 27, 2004, now Pat. No. 6,999,017, which is a division of application No. 09/612,099, filed on Jul. 7, 2000, now Pat. No. 6,784,864.

(30) Foreign Application Priority Data

Jul. 12, 1999 (JP) ................................. 11-198234

(51) Int. Cl.
*H03M 1/66* (2006.01)

(52) U.S. Cl. .......................... 341/144; 345/98; 345/100

(58) Field of Classification Search ................ 341/144; 455/236, 465; 345/98, 99, 84, 100; 348/333.03
See application file for complete search history.

(56) References Cited

U.S. PATENT DOCUMENTS 4,342,984 A  8/1982 Berke et al.

(Continued)

FOREIGN PATENT DOCUMENTS

JP  07-130652  5/1995

(Continued)

OTHER PUBLICATIONS

Furue et al., "Characteristics and Driving Scheme of Polymer-Stabilized Monostable FLCD Exhibiting Fast Response Time and High Contrast Ratio with Gray Scale Capability", SID 98 DIGEST, pp. 782-785, no month.

(Continued)

*Primary Examiner*—Jean B Jeanglaude
(74) *Attorney, Agent, or Firm*—Nixon Peabody LLP; Jeffrey L. Costellia

(57) ABSTRACT

A digital driver for display devices which can prevent the delay of digital data and the extended transition time of the digital data, and thus can make good display, and a display device including the above-mentioned digital driver are disclosed. The digital driver according to the present invention is constituted in such a manner that, by successively inputting digital data to a shift register, the digital data are shifted in the shift register, and the resulting output is sent out to latch circuits. Since the digital data are directly inputted to the shift register, the distance over which the data lines are laid around can be shortened, the increase in load due to the laying-around of the data lines which has so far been a problem can be prevented, and the delay of the digital data and the extended transition time of the digital data can be prevented.

32 Claims, 17 Drawing Sheets

U.S. PATENT DOCUMENTS

| | | |
|---|---|---|
| 5,345,250 A | 9/1994 | Inoue et al. |
| 5,353,330 A * | 10/1994 | Fujiwara ..................... 455/563 |
| 5,359,343 A | 10/1994 | Nakamura |
| 5,523,772 A | 6/1996 | Lee |
| 5,552,801 A | 9/1996 | Furuhashi et al. |
| 5,589,847 A | 12/1996 | Lewis |
| 5,594,569 A | 1/1997 | Konuma et al. |
| 5,604,511 A | 2/1997 | Ohi |
| 5,643,826 A | 7/1997 | Ohtani et al. |
| 5,706,049 A * | 1/1998 | Moghadam et al. ... 348/333.03 |
| 5,745,808 A * | 4/1998 | Tintera ....................... 396/236 |
| 5,832,386 A * | 11/1998 | Nojima et al. .............. 455/465 |
| 5,923,962 A | 7/1999 | Ohtani et al. |
| 6,229,513 B1 | 5/2001 | Nakano et al. |
| 6,256,024 B1 | 7/2001 | Maekawa |
| 6,356,223 B1 | 3/2002 | Tanaka |
| 6,441,758 B1 | 8/2002 | Koyama et al. |
| 6,496,130 B2 | 12/2002 | Nagao |
| 6,597,349 B1 | 7/2003 | Koyama et al. |
| 6,664,943 B1 | 12/2003 | Nakajima et al. |
| 6,784,864 B1 | 8/2004 | Koyama et al. |
| 6,999,017 B2 | 2/2006 | Koyama et al. |
| 7,190,297 B2 * | 3/2007 | Koyama et al. ............ 341/144 |

FOREIGN PATENT DOCUMENTS

| | | |
|---|---|---|
| JP | 2001-75543 | 3/2001 |

OTHER PUBLICATIONS

Yoshida et al., "A Full-Color Thresholdless Antiferroelectric LCD Exhibting Wide Viewing Angle with Fast Response Time," SID 97 DIGEST, pp. 841-844, no month.

Inui et al., "Thresholdless Antiferroelectricity in liquid crystals and its application to displays", J. Mater. Chem., 1996, 6(4), pp. 671-673, no month.

Matsueda et al., "Low Temperature Poly-Si TFT-LCD with Integrated 6-bit Digital Data Drivers", SID 1996 DIGEST pp. 21-24, no month.

Koyama et al., "A 4.0-in. Poly Si TFT-LCD with Integrated 6-bit Digital Data Driver Using CGS Technology", AMLCD 1999 pp. 29-32, month unknown.

* cited by examiner

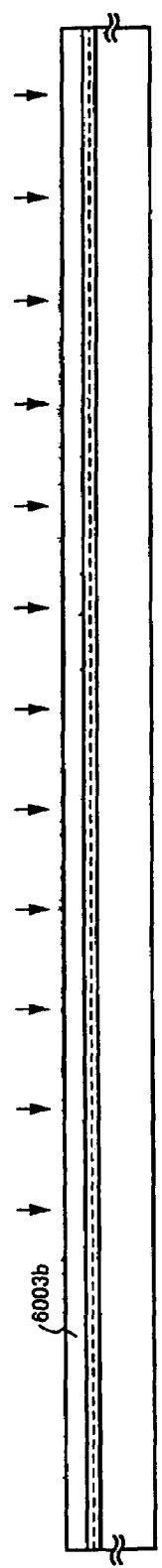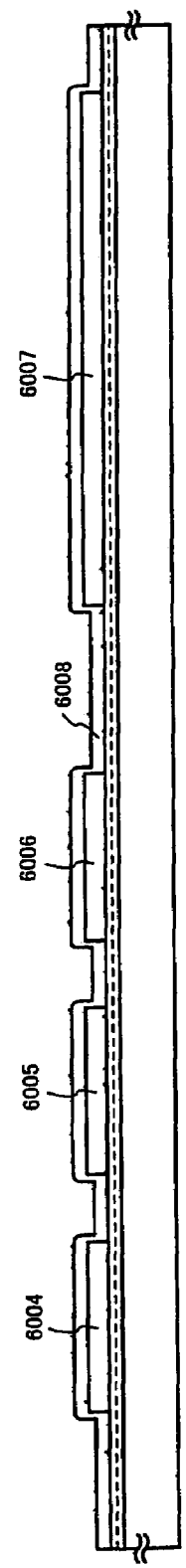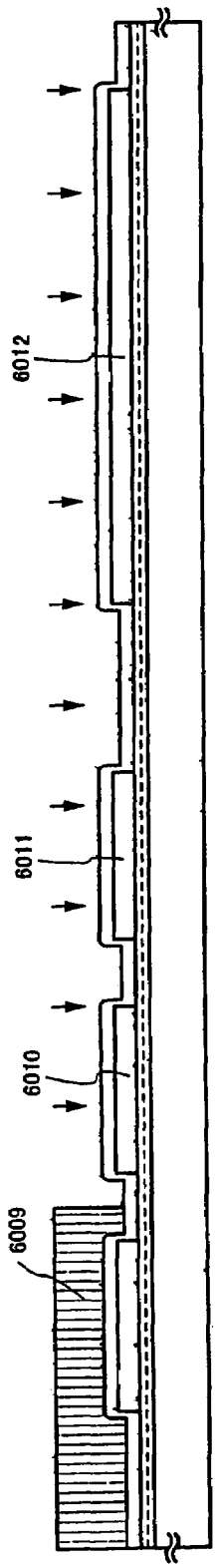

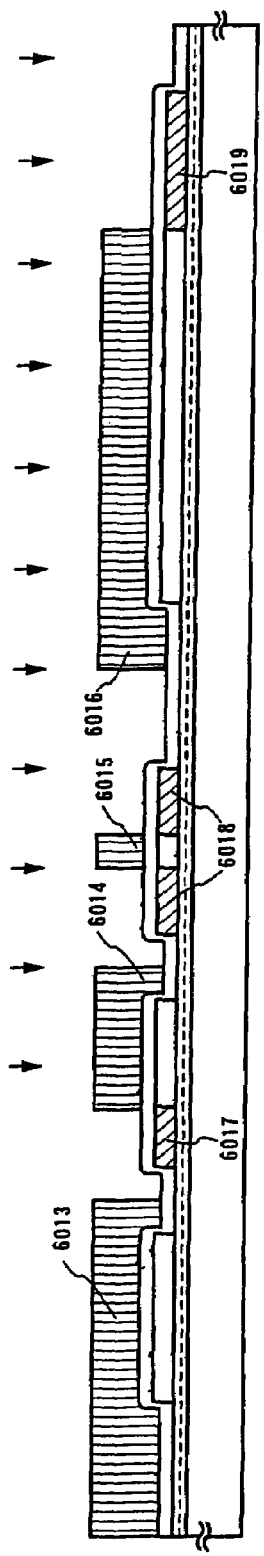
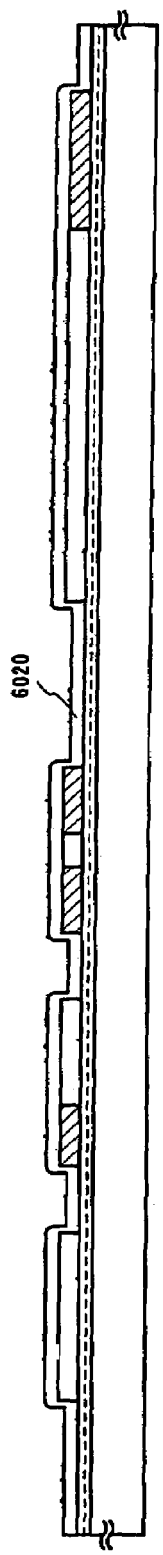
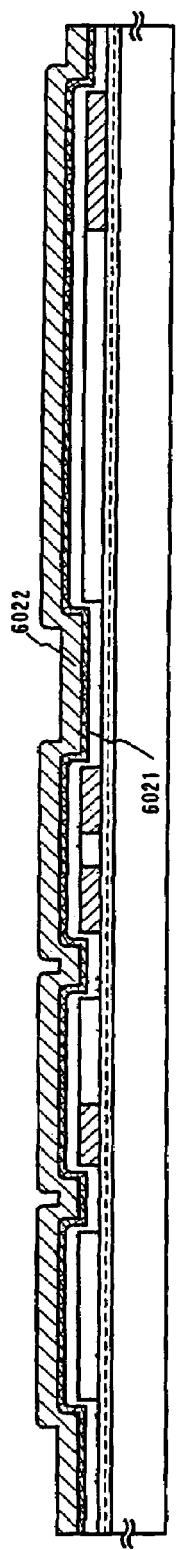
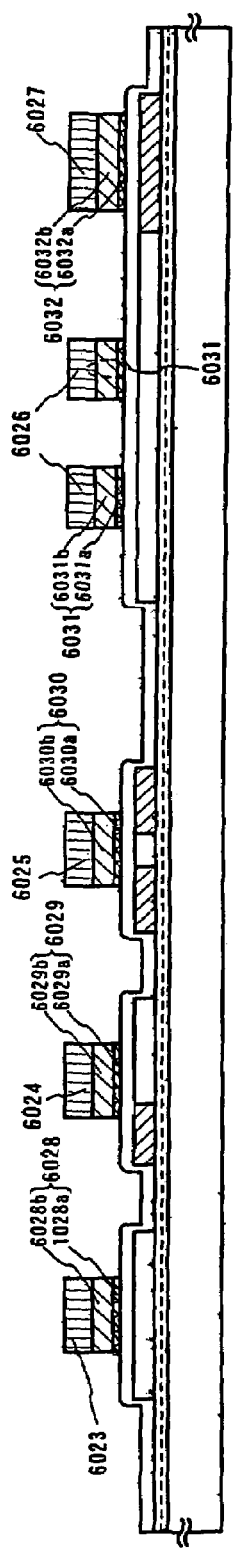
Fig. 9A
Fig. 9B
Fig. 9C
Fig. 9D

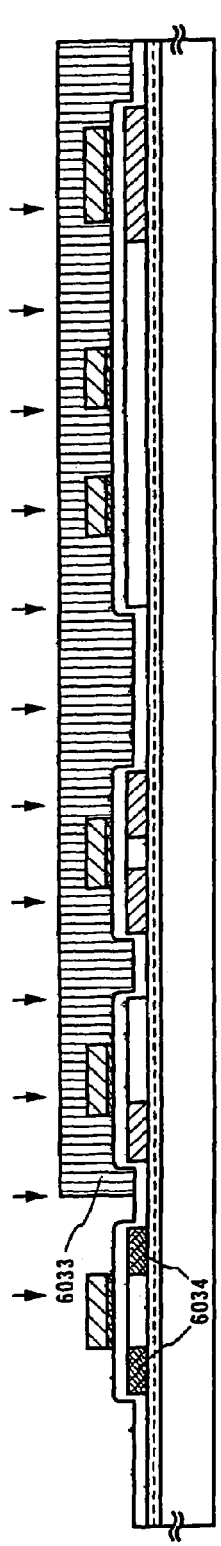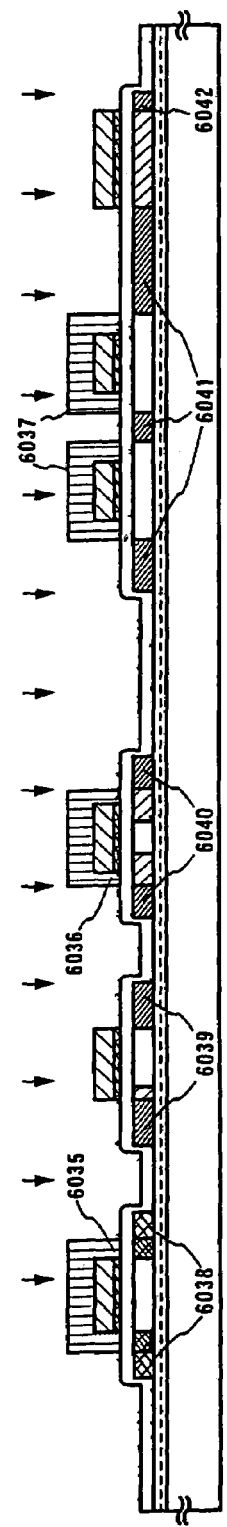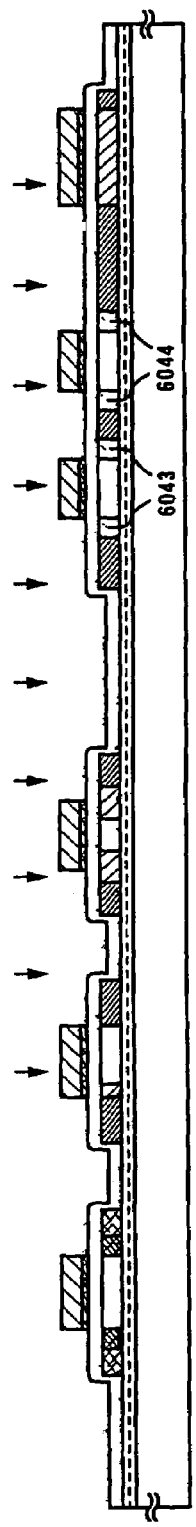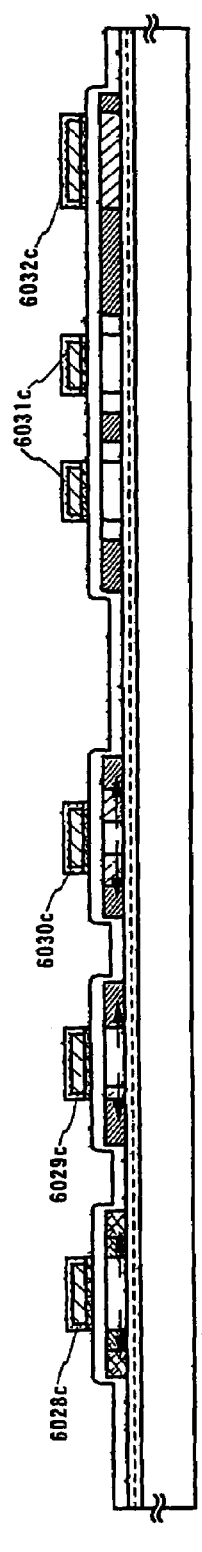

DIGITAL DRIVER AND DISPLAY DEVICE

This application is a Divisional of U.S. application Ser. No. 11/311,167 filed Dec. 20, 2005, now U.S. Pat. No. 7,190,297; which is a Divisional of application Ser. No. 10/926,956 filed Aug. 27, 2004, now U.S. Pat. No. 6,999,017; which is a Divisional of application Ser. No. 09/612,099 filed Jul. 7, 2000, now U.S. Pat. No. 6,784,864.

BACKGROUND OF THE INVENTION

1. Field of the Invention

The present invention relates to a digital driver for display devices. The invention further relates to a display device including the digital driver according to the invention. Further, as the display medium of the display device including the digital driver according to the invention, liquid crystal, organic EL or the like can be used.

2. Description of the Related Art

Recently, the technique of fabricating a semiconductor device such as, e.g., thin-film transistors (TFT), constituted in such a manner that a semiconductor thin-film is formed on a cheap glass substrate has been rapidly developed. It is because the demand for active matrix semiconductor display devices (particularly, active matrix liquid crystal display devices) is growing.

An active matrix liquid crystal display device is constituted in such a manner that a TFT is disposed in each of several tens to several millions of picture element regions matrixwise disposed, and the electric charges entering and leaving each picture element electrode are controlled by the switching function of the TFT.

Among such active matrix liquid crystal display devices, a digital drive type active matrix liquid crystal display device which can be driven at high speed is attracting attention as display devices are becoming more and more fine and precise and their picture quality is more and more improved. The digital drive type active matrix liquid crystal display device includes a digital driver for processing digital data.

FIG. 15 shows a known digital drive type active matrix liquid crystal display device. This known digital drive type active matrix liquid crystal display device comprises a shift register 2001, data lines (a to d) 2002 to which digital data are inputted, latch circuits 1 (LAT1) 2003, latch circuits 2 (LAT2) 2004, a latch pulse line 2005, D/A converter circuits 2006, a gradation voltage lines 2007 for feeding a voltage to the D/A converter circuits 2006, source signal lines 2008, a shift register 2009 at the gate signal line side, gate signal lines (scanning lines) 2010, and picture element TFTs 2011. Here, a 4-bit digital drive type active matrix liquid crystal display device is shown by way of example. The latch circuits 1 and the latch circuits 2 (LAT1 and LAT2) are each shown in the state in which four latch circuits corresponding to the respective bits of the digital data are put together for convenience' sake.

In, e.g., Matsueda et al.: "Low Temperature Poly-Si TFT-LCD with integrated 6-bit Digital Data Drivers" (SID 96 DIGEST pp. 21 to 24), known digital drive type active matrix liquid crystal display devices are described.

In case of the known digital drive type active matrix liquid crystal display device shown in FIG. 15, the digital signals (digital video data) fed to the data lines (a to d) 2002 are written into the group of latch circuits (LAT1) one after another in accordance with the timing signals from the shift register.

The time spent until the writing of the digital signal into the LAT1 group is completely terminated is called one line period. In other words, the time interval from the point of time when the writing of the digital signals into the leftmost LAT1 is started to the point of time when the writing of the digital signals into the rightmost LAT1 is completed is one line period.

After the writing of the digital signals into the LAT1 group, the digital signals thus written into the LAT1 group are simultaneously sent out and written into the LAT2 group, when a latch pulse flows to the latch pulse line, in tune with the operating timing of the shift register.

Into the LAT1 group which has completely sent out the digital signals to the LAT2 group, the writing of digital signals is successively carried out again in accordance with the signals from the shift register.

During this second one-line period, a voltage corresponding to the digital signals sent out to the LAT2 group in step with the start of the second one-line period is fed to a source signal line. The driver referred to here by way of example executes the conversion of the digital signals to a gradation voltage by selecting one of 16 gradation voltages by the D/A converter circuits.

The thus selected gradation voltage is fed to the corresponding source signal line during one line. By the scanning signal from the shift register at the gate signal line side, the corresponding TFT is switched, whereby the liquid crystal molecules are driven.

By repeating the above-mentioned operation by a number of times corresponding to the number of the scanning lines, one frame is formed. In general, in an active matrix liquid crystal display device, pictures of 60 frames are re-written for one second.

As shown in FIG. 15, in the known digital driver, the data lines (a to d) 2002 to which digital data fed must feed the digital data to all the latch circuits 1 (2003), and thus, the laid-around length of the wirings of the data lines in the digital driver is very large. As a result, the load (the parasitic capacitance and resistance) of the data lines 2002 becomes large, so that the delay of the digital data, so-called the extended transition time of the digital data is increased.

By the use of the known digital driver, the display of pictures cannot be executed on the basis of accurate digital data, due to the above-mentioned delay of the digital data and the extended transition time of the digital data in some cases, and thus, good display could not be made in some cases.

SUMMARY OF THE INVENTION

Thus, the present invention has been achieved in view of the above-mentioned problem; the invention thus provides a digital driver for display devices which can prevent the delay of the digital data and the extended transition time of the digital data to make good display and also provides a display device including the just-mentioned digital driver.

In the digital driver according to the invention, digital data are successively inputted to a shift register, whereby the digital data are shifted in the shift register, and the output thereof is sent out to latch circuits.

In the digital deriver according to the invention, digital data are inputted directly to the shift register, so that the distance over which the data lines are laid around can be shortened; and thus, the increase in load due to the laying-around of the data lines which has so far been a problem can be prevented, and the delay of the digital data and the extended transition time of the digital data can be prevented.

The constitution of the invention will be described below.

According to a first aspect of the invention, a digital driver comprises a shift register circuit including a plurality of register circuits, and a latch circuit array including a plurality of latch circuits, wherein digital data are inputted to the shift register circuit, the digital data successively shift through the plurality of register circuits, and to the plurality of latch circuits, the outputs of the digital data from the corresponding ones of the register circuits are inputted.

According to a second aspect of the invention, a digital driver comprises a shift register circuit which has a register circuit at the first stage, a register circuit at the second stage, . . . , a register circuit at the $(n-1)^{th}$ stage and a register circuit at the $n^{th}$ stage (wherein n stands for a natural number), and a latch circuit array including a first latch circuit, a second latch circuit, . . . , an $(n-1)^{th}$ latch circuit and an $n^{th}$ latch circuit, wherein first digital data, second digital data, . . . , an $(n-1)^{th}$ digital data and an $n^{th}$ digital data are successively inputted to the register circuit at the first stage, the output of the register circuit at the first stage, the output of the register circuit at the second stage, . . . , the output of the register circuit at the $(n-1)^{th}$ stage and the output of the register circuit at the $n^{th}$ stage are respectively sent out to the first latch circuit, the second latch circuit, . . . , the $(n-1)^{th}$ latch circuit and the $n^{th}$ latch circuit, the instant the first digital data is inputted to the register circuit at the $n^{th}$ stage, the oscillation of a clock signal inputted to the shift register circuit stops, and the $n^{th}$ digital data, the $(n-1)^{th}$ digital data, . . . , the second digital data and the first digital data which are respectively held in the register circuit at the first stage, the register circuit at the second stage, . . . , the register circuit at the $(n-1)^{th}$ stage and the register circuit at the $n^{th}$ stage are respectively read into the first latch circuit, the second latch circuit, . . . , the $(n-1)^{th}$ latch circuit and the $n^{th}$ latch circuit.

According to a third aspect of the invention, a display device comprises

TFTs disposed in a matrix shape, a source driver, and a gate driver, wherein the source driver comprises a shift register circuit which includes a plurality of register circuits and a latch circuit array which includes a plurality of latch circuits, to the shift register circuit, digital data are inputted, the digital data successively shift through the plurality of register circuits, and, to the plurality of latch circuits, the digital data outputs from the corresponding ones of the register circuits are inputted.

According to a fourth aspect of the invention, a display device comprises

TFTs disposed in a matrix shape, a source driver, and a gate driver, wherein the source driver comprises a shift register circuit which includes a register circuit at the first stage, a register circuit at the second stage, . . . , a register circuit at the $(n-1)^{th}$ stage and a register circuit at the $n^{th}$ stage (wherein n stands for a natural number) and a latch circuit array which includes a first latch circuit, a second latch circuit, . . . , an $(n-1)^{th}$ latch circuit and an $n^{th}$ latch circuit, first digital data, second digital data, . . . , $(n-1)^{th}$ digital data and $n^{th}$ digital data are successively inputted to the register circuit at the first stage, the output of the register circuit at the first stage, the output of the register circuit at the second stage, . . . , the output of the register circuit at the $(n-1)^{th}$ stage and the output of the register circuit at the $n^{th}$ stage are respectively sent out to the first latch circuit, the second latch circuit, . . . , the $(n-1)^{th}$ latch circuit and the $n^{th}$ latch circuit, and the instant the first digital data is inputted to the register circuit at the $n^{th}$ stage, the oscillation of a clock signal inputted to the shift register circuit stops, so that the $n^{th}$ digital data, the $(n-1)^{th}$ digital data, . . . , the second digital data and the first digital data which are respectively held in the register circuit at the first stage, the register circuit at the second stage, . . . , the register circuit at the $(n-1)^{th}$ stage and the register circuit at the $n^{th}$ stage are respectively taken into the first latch circuit, the second latch circuit, . . . , the $(n-1)^{th}$ latch circuit and the $n^{th}$ latch circuit.

Here, description will be made on the mode for carrying out the invention.

FIG. 1 will be referred to. FIG. 1 is a circuit block diagram showing the shift register circuit and the latch circuit array of the m-bit digital driver according to an embodiment of the invention. The shift register circuit and the latch circuit array shown in FIG. 1 process the first bit of m-bit digital data. Thus, the m-bit digital driver according to this embodiment comprises m such circuits as shown in FIG. 1.

The reference numeral 100 denotes a shift register circuit. The shift register circuit 100 includes n register circuits 101 (DFF1 to DFFn) (wherein n stands for a natural number) at a first stage to the $n^{th}$ stage. To the n register circuits (DFF1 to DFFn) in the shift register circuit, a clock signal line 102, a clock-back signal line 103 and a digital data line 104 are connected, so that, by the respective signal lines, a clock signal (CLK), a clock-back signal (CLKB) which is the inversion signal of the clock signal, and digital data (DIGITAL DATA) are inputted. Further, the digital data (DIGITAL DATA) fed to the shift register circuit 100 are inputted to the register circuit (DFF1) at the first stage.

Numeral 110 denotes a latch circuit array. The latch circuit array 110 includes first to $n^{th}$ latch circuits 111 (LATCH1 to LATCHn). To the latch circuits 111 (LATCH1 to LATCHn) of the latch circuit array 110, a latch signal line 112 and a latch-back signal line 113 are connected, and thus, by the respective signal lines, a latch signal (LAT) and a latch-back signal (LATB) which is the inversion signal of the latch signal are inputted.

Here, the operation of the digital driver according to the invention will be described, referring to FIG. 2. FIG. 2 shows a timing chart pertaining to the shift register circuit and the latch circuit array of the source driver according to this embodiment.

To the register circuit DFF1 at the first stage of the source driver, there are inputted a lock signal (CLK), a clock-back signal (CLKB), and the digital data fed to the source driver. To the register circuit DFF1, the first digital data (1_1), the second digital data (2_1), the third digital data (3_1), . . . , the $(n-1)^{th}$ digital data (n-1_1) and the $n^{th}$ digital data (n_1) are successively inputted (DFF1 input shown in FIG. 2).

The DFF1 shifts and outputs the inputted data successively (DFF1 output and S1 shown in FIG. 2) on the basis of the clock signal (CLK) and the clock-back signal (CLKB), thus successively sending the digital data out to the register circuit DFF2 at the following stage. The reference symbol t1 stands for the pulse width of one-bit digital data.

To the register circuit DFF2 at the second stage, the digital data outputted from the DFF1 are inputted; and the register circuit DFF2 successively shifts and outputs the inputted digital data (DFF2 outputs and S2 shown in FIG. 2) on the basis of the clock signal (CLK) and the clock-back signal (CLKB), thus successively sending out the digital data to the register circuit DFF3 at the following stage.

As stated above, the digital data inputted to the register circuit DFF1 at the first stage are shifted through the register circuits one after another on the basis of the clock signal (CLK) and the clock-back signal (CLKB), finally becoming the output of the register circuit DFFn at the final stage (the $n^{th}$ stage) (the DFFn output and Sn shown in FIG. 2).

The period during which the digital data (1_1) inputted to the register circuit DFF1 at the first stage become the output of the register circuit DFFn at the final stage is called line period ($T_L$). During this line period ($T_L$), the clock signal (CLK) and the clock-back signal (CLKB) are continuously fed to all the register circuits (DFF1 to DFFn). Further, during the line period ($T_L$), the latch signal (LAT) and the latch-back signal (LATB) are controlled so that new digital data may not be inputted to the latch circuits.

Further, between a line period ($T_L$) and the next line period ($T_L$), a horizontal retrace line period ($T_{HB}$) exists. During this horizontal retrace line period ($T_{HB}$), the oscillation of the clock signal (CLK) and the clock-back signal (CLKB) is stopped (See FIG. 2). By this measure, during the horizontal retrace line period ($T_{HB}$), the register circuits (DFF1 to DFFn) hold the outputs (S1 to Sn) of the digital data and thus output the digital data to corresponding ones of the first to $n^{th}$ latch circuits (LATCH1 to LATCHn) without fail.

As shown in FIG. 2, during this latch period ($T_{LA}$), the output (n–1) of the register circuit DFF1 at the first stage is inputted to the first latch circuit LATCH1, the output (n–1_1) of the register circuits DFF1 at the second stage is inputted to the second latch circuit LATCH2, and the output (1_) of the register circuit DEF1 at the $n^{th}$ stage is inputted to the $n^{th}$ latch circuit LATCHn. Further, the sum of the line period ($T_{HB}$) and the horizontal retrace line period ($T_{HB}$) is called horizontal period ($T_H$).

During the horizontal retrace line period ($T_{HB}$), the latch signal (LAT) and the latch-back signal (LATB) are inputted within the latch period ($T_{LA}$), and the respective latch circuits (LATCH1 to LATCHn) take in the digital data held in the register circuits.

In this way, the digital data (n_1 to 1_1) are taken into the all the first to $n^{th}$ latch circuits (LATCH1 to LATCHn), respectively. Thus, it can be understood that the digital data (n_1 to 1_1) are taken into the $n^{th}$ to first latch circuits (LATCHn to LATCH1) in the order of the digital data being inputted.

After the termination of the horizontal retrace line period ($T_{HB}$), a line period ($T_L$) starts again, and the oscillation of the clock signal (CLK) and the clock-back signal (CLKB) is resumed. Then the digital data inputted to the resister circuits DFF1 at the first stage shift through the register circuits one after another on the basis of the clock signal (CLK) and the clock-back signal (CLKB).

By repeating the above-mentioned operation, the digital data inputted to the shift register circuit 100 can be outputted in parallel to the latch circuit array 110. In this specification, a driving method as according to the present invention will be called the data shift system in view of the fact that the digital data shift through the registers.

The digital data outputted to the latch circuit array 110 are converted into analog data by D/A converters and the like and outputted to the display portion of the display device.

In case of the data shift system according to the present invention, the data are inputted directly to the shift register circuit, and the data themselves shift one after another, so that, while the clock signal (CLK) and the clock-back signal (CLKB) are fed to the shift register circuit, the output digital data of the respective register circuits (DFF1 to DFFn) are rewritten successively. In order to obtain the digital data to be originally maintained as the outputs of the respective register circuits, it is necessary to ensure that the output digital data of the respective register circuits are not rewritten successively. In other words, in order to ensure that, when the digital data are established as the outputs of the respective register circuits, the oscillation of the clock signal (CLK) and the clock-back signal (CLKB) must be stopped so that the digital data can be held. Further, it is immediately after the termination of the line period that the output digital data of the respective register circuits are established, and, when the next line period starts, new digital data are inputted to the register circuits (DFF1) at the first stage. Thus, it follows that the period during which the oscillation of the clock signal (CLK) and the clock-back signal (CLKB) is to be stopped is the horizontal retrace line period ($T_{HB}$) between a line period ($T_L$) and the next line period ($T_L$).

In the digital driver according to the invention, the digital data are inputted directly to the shift registers, so that the laying-around distance of the data lines can be shortened; and thus, the increase in load due to the laying-around of the data lines which has so far been a problem to be overcome can be prevented, and thus, the delay of the digital data and the extended transition time of the digital data can be prevented.

BRIEF DESCRIPTION OF THE DRAWINGS

FIGS. 8A-8D show diagrams explaining some steps of manufacturing a liquid crystal display device including the digital driver according to Embodiment 2 of the invention.

FIGS. 9A-9D show diagrams explaining other steps of manufacturing a liquid crystal display device including the digital driver according to Embodiment 2 of the invention.

FIGS. 10A-10D show diagrams explaining still other steps of manufacturing a liquid crystal display device including the digital driver according to Embodiment 2 of the invention.

DESCRIPTION OF THE PREFERRED EMBODIMENTS

Here, embodiments of the digital driver according to the invention will be described below.

Embodiment 1

Figure 1:
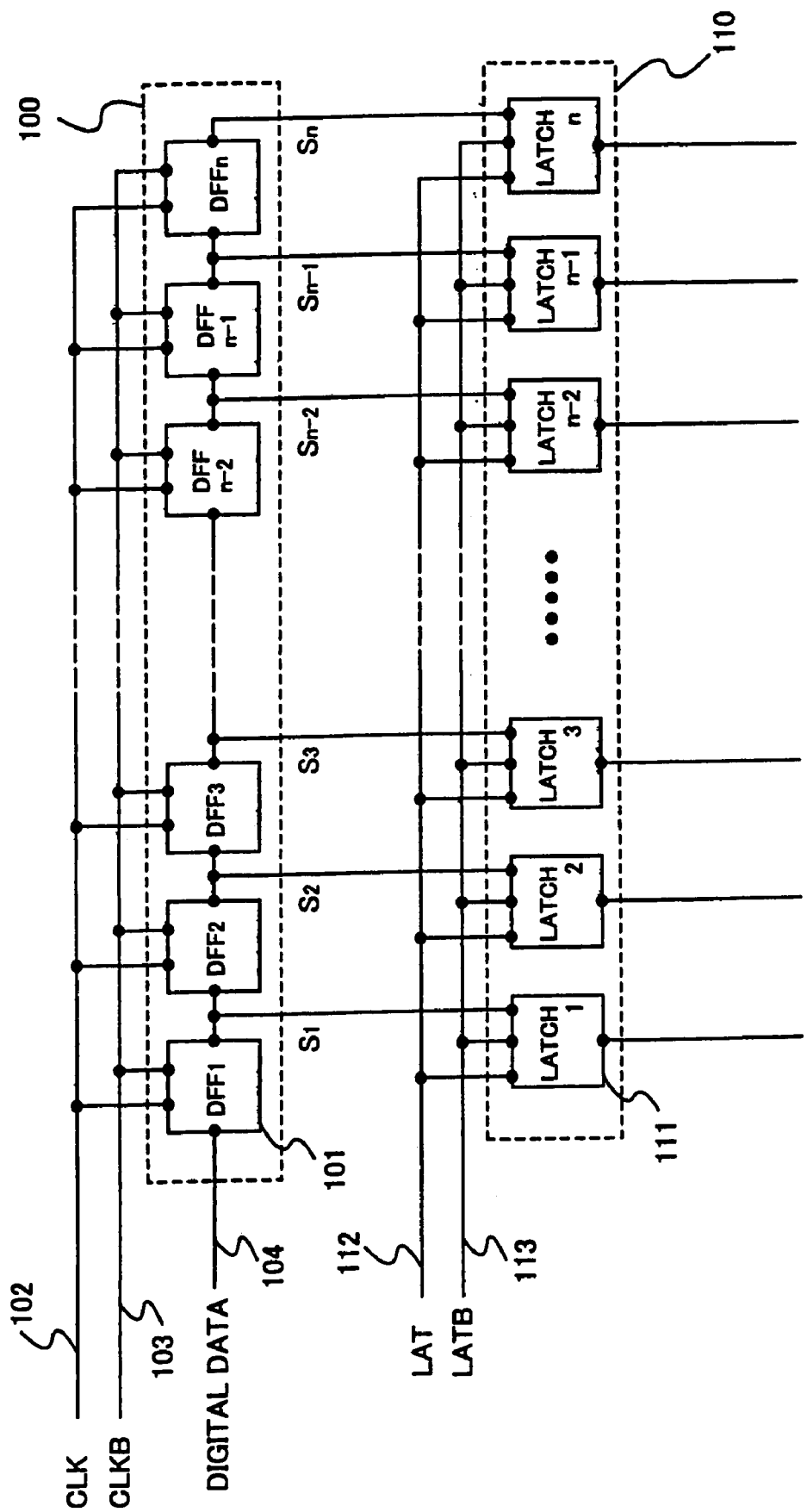
FIG. 1 is a circuit block diagram of the digital driver circuit according to the present invention.
Figure 2:
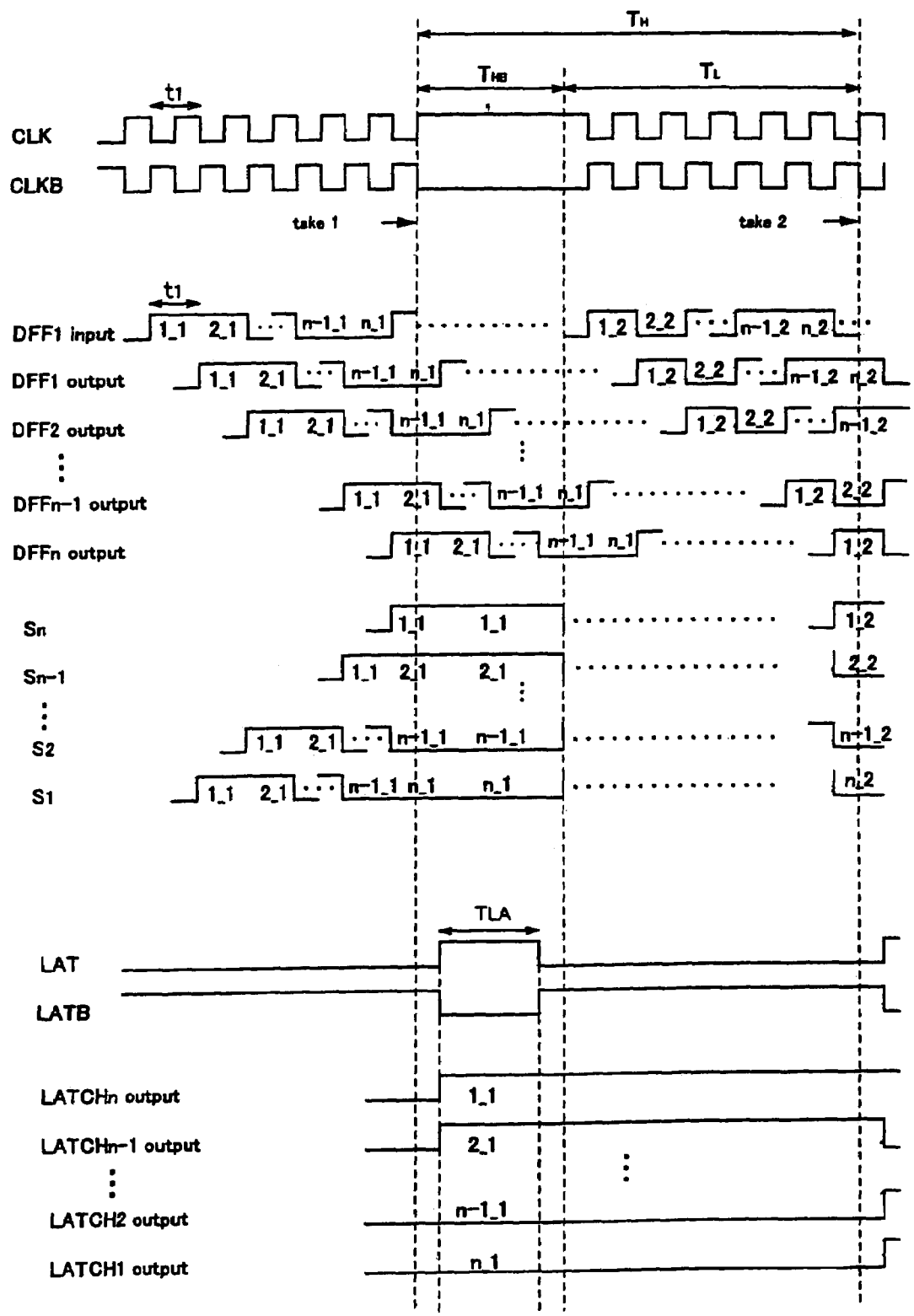
FIG. 2 is a timing chart of the digital driver according to the invention.
Figure 3:
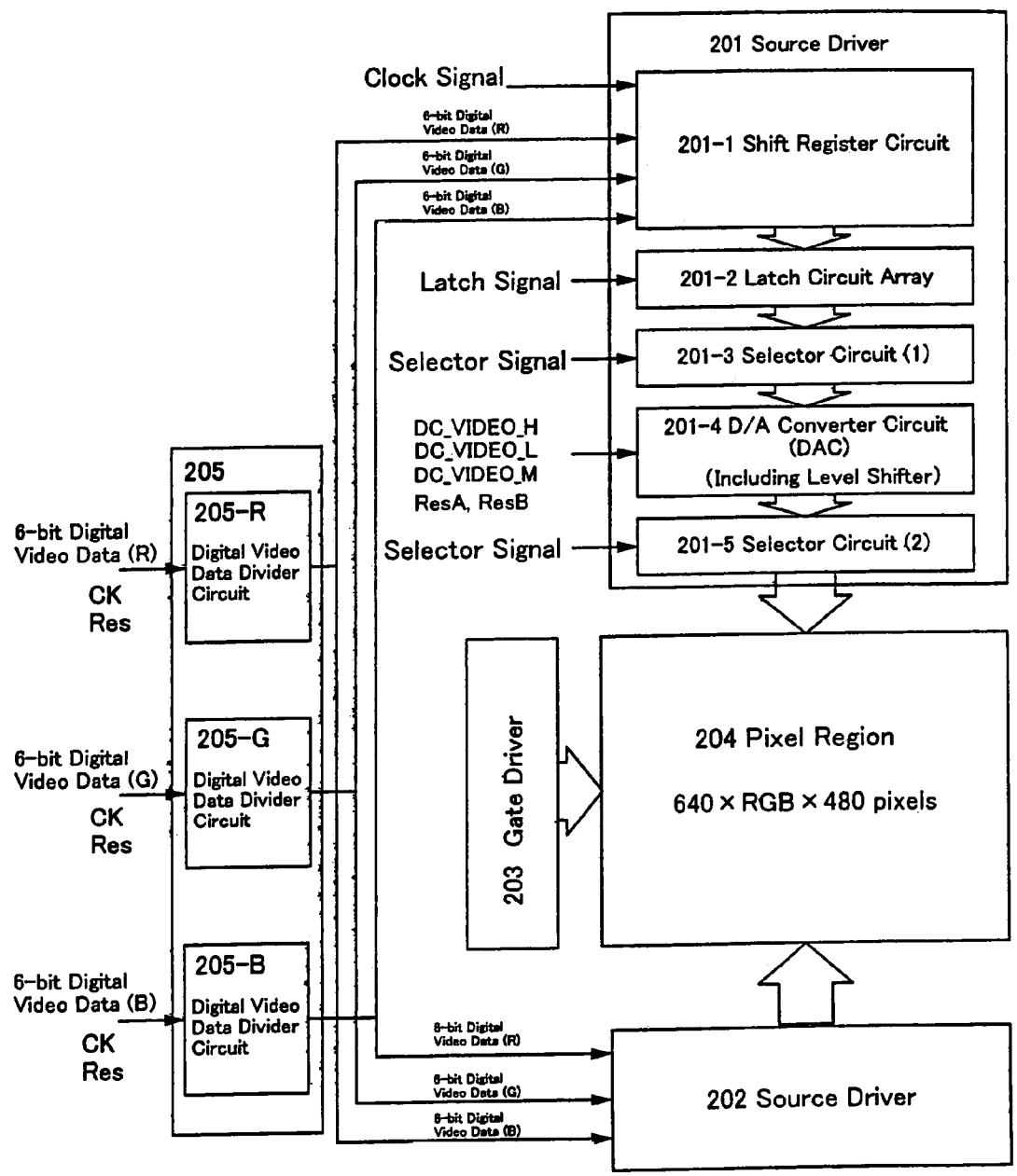
FIG. 3 is a circuit block diagram of a liquid crystal display device including the digital driver according to Embodiment 1 of the invention.

This embodiment relates to a liquid crystal display device including a 6-bit digital driver. FIG. 3 will be referred to. FIG. 3 shows a circuit block diagram of the liquid crystal display device according to this embodiment. A source driver 201 comprises a shift register circuit 201-1, a latch circuit array 201-2, a selector circuit (1) 201-3, a D/A converter circuit 201-4, and a selector circuit (2) 201-5. Beside the above, the source driver 201 includes a buffer circuit and a level shifter circuit (Neither of them are shown). Further, for convenience in description, the D/A converter circuit 201-4 includes a level shifter circuit.

The source driver 201 feeds analog data (gradation voltage) to even-numbered picture elements (even-numbered source signal lines), and a source driver 202 feeds analog data (gradation voltage) to the odd-numbered picture elements (odd-numbered source signal lines).

Further, numeral 203 denotes a gate driver, which includes a shift register circuit, a buffer circuit, a level shifter circuit, etc. (None of them are shown).

A picture element portion 204 contains 640×RGB×480 picture elements. In each picture element, a picture element TFT is disposed, and, to the source region of each picture element TFT, a source signal line is electrically connected, while, to the gate electrode, a gate signal line is electrically connected. Further, to the drain region of each picture element TFT, a picture element electrode is electrically connected. Each picture element TFT controls the feed of analog data (gradation voltage) to the picture element electrode electrically connected to each picture element TFT. To each picture element electrode, the analog data (gradation voltage) is fed, and, to the liquid crystal sandwiched between each picture element electrode and the facing electrode, a voltage is applied, whereby the liquid crystal is driven.

Numeral 205 denotes a digital video data divider circuit (which is called SPC: Serial-to-Parallel Conversion Circuit in some cases). To 205-R, 205-G and 205-R, digital video data corresponding to red, green and blue pictures are inputted, respectively. The digital video data divider circuit 205 is a circuit for lowering to 1/x the frequency of the digital video data inputted from the outside (wherein x stands for a natural number of 2 or greater). By dividing the digital video data inputted from the outside, the frequency of the signal necessary for the operation of the driving circuit can also be lowered to 1/x. In the liquid crystal display device according to this embodiment, the digital video data divider circuit 205 converts the 6-bit digital video data of 25 MHz inputted from the outside into eight parallel 6-bit digital video data of 3.125 MHz and outputs them to the source drivers.

Figure 4:
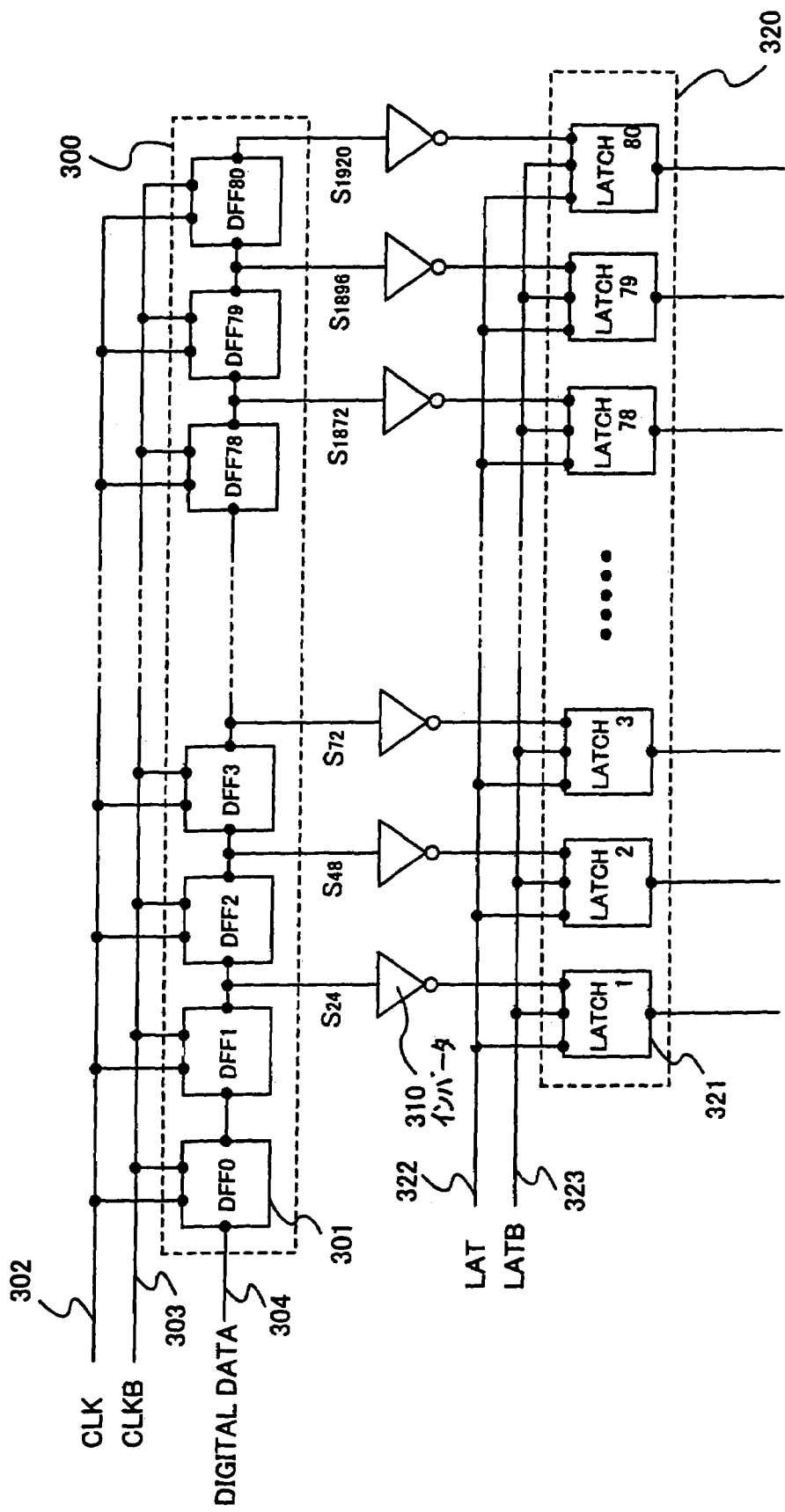
FIG. 4 is a circuit block diagram of the digital driver according to Embodiment 1 of the invention.

Here, FIG. 4 will be referred to. FIG. 4 is a block diagram showing portions of the shift register circuit 201-1 and the latch circuit array 201-2 in the source driver 201 of the liquid crystal display device according to this embodiment. More specifically, there are shown a shift register circuit 300 and latch circuit array 301 which process the first bit of the 6-bit digital data corresponding to $24^{th}$, $48^{th}$, $72^{nd}$, $1872^{nd}$, $1896^{th}$ and $1920^{th}$ picture elements (picture elements of R) in the picture element portion.

Figure 5:
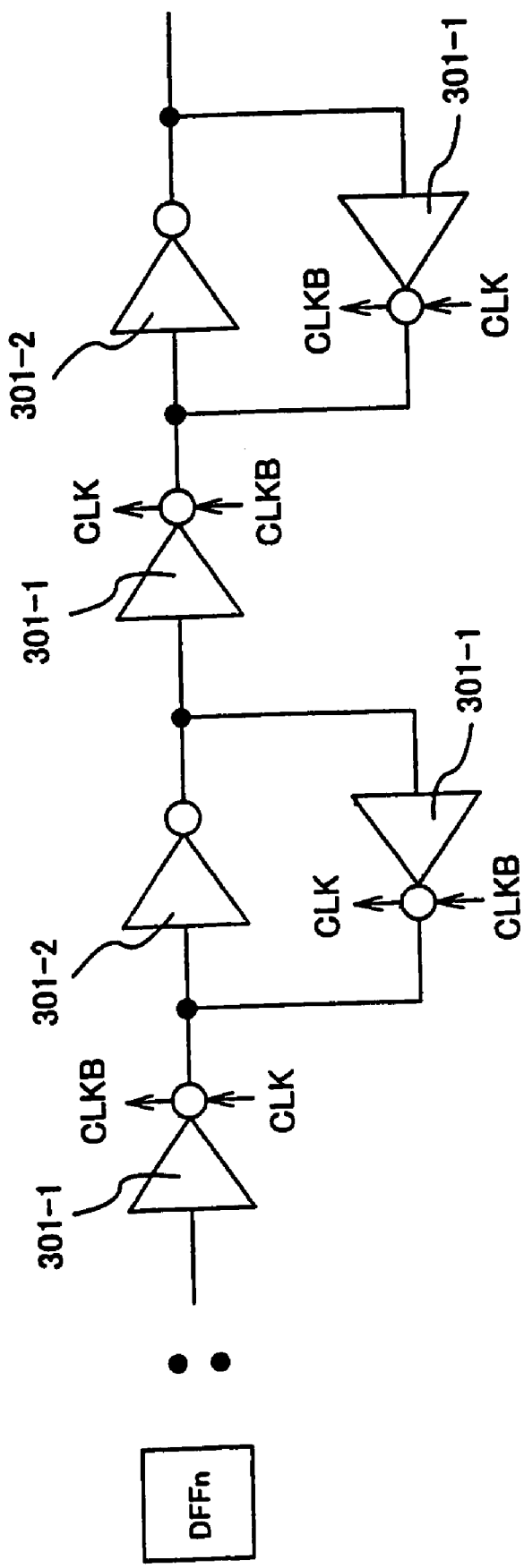
FIG. 5 is a circuit diagram of the register circuits in the digital driver according to Embodiment 1 of the invention.

The shift register circuit 300 includes 81 register circuits 301 (DFF0 to DFF80). In this embodiment, the register circuits are DFF circuits (D flip-flop circuits), the circuit arrangement of which is shown in FIG. 5. Referring to FIG. 5, numeral 301-1 denotes clocked inverters, and numeral 301-2 denotes inverters.

To the 81 register circuits (DFF0 to DFF80) of the shift register circuit 300, a clock signal line 302, a clock-back signal line 303 and a digital data line 304 are connected, so that, by the respective signal lines, a clock signal (CLK), a clock-back signal (CLKB) being the inversion signal of the clock signal, and digital data (DGITAL DATA) are inputted. Further, the digital data (DIGITAL DATA) fed to the shift register circuit 300 is inputted to the shift register circuit (DFF0) at the first stage. The register circuit (DFF0) at the $0^{th}$ stage is a dummy register circuit, and its output is not directly inputted to any latch circuit. Further, in this embodiment, the dummy register circuit (DFF0) is used, but the design may alternatively be made so as not to use it.

For convenience in description, to the output lines (S24 to S1920) of the register circuits (DFF1 to DFF80), numerals corresponding to the respective picture elements concerned are affixed.

Figure 6:
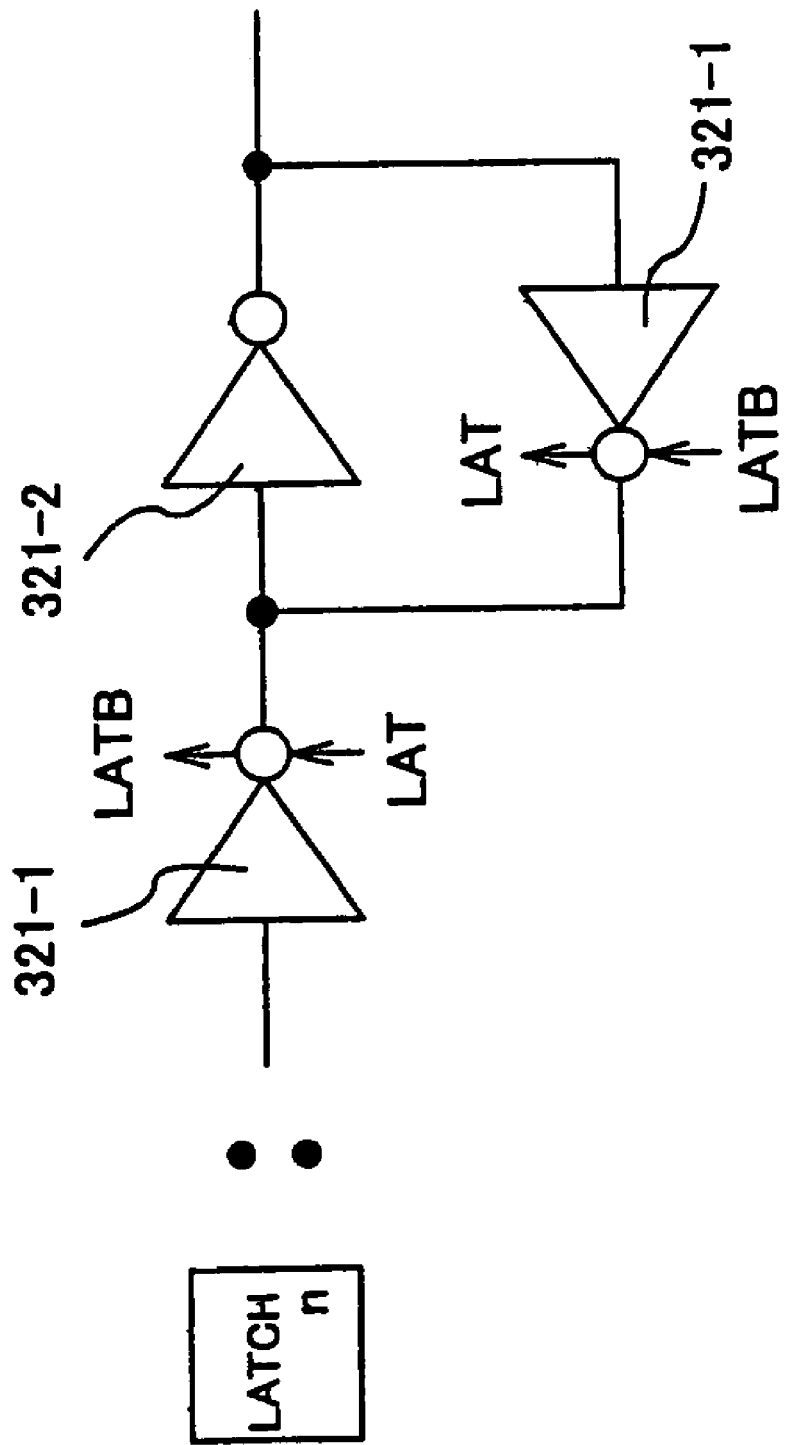
FIG. 6 is a circuit diagram of the latch circuit in the digital driver according to Embodiment 1 of the invention.

Numeral 320 denotes a latch circuit array. The latch circuit array 320 includes 80 latch circuits 321 (LATCH1 to LATCH80). FIG. 6 shows the circuit arrangement of the latch circuits 321. Referring to FIG. 6, numeral 321-1 denotes clocked inverters, and numeral 321-2 denotes an inverter. To all the latch circuits (LATCH 1 to LATCH 80) of the latch circuit array 320, a latch signal line 322 and a latch-back signal line 323 are connected, so that, by the respective signal lines, a latch signal (LAT) and a latch-back signal (LATB) being the inversion signal of the latch signal are inputted.

Figure 7:
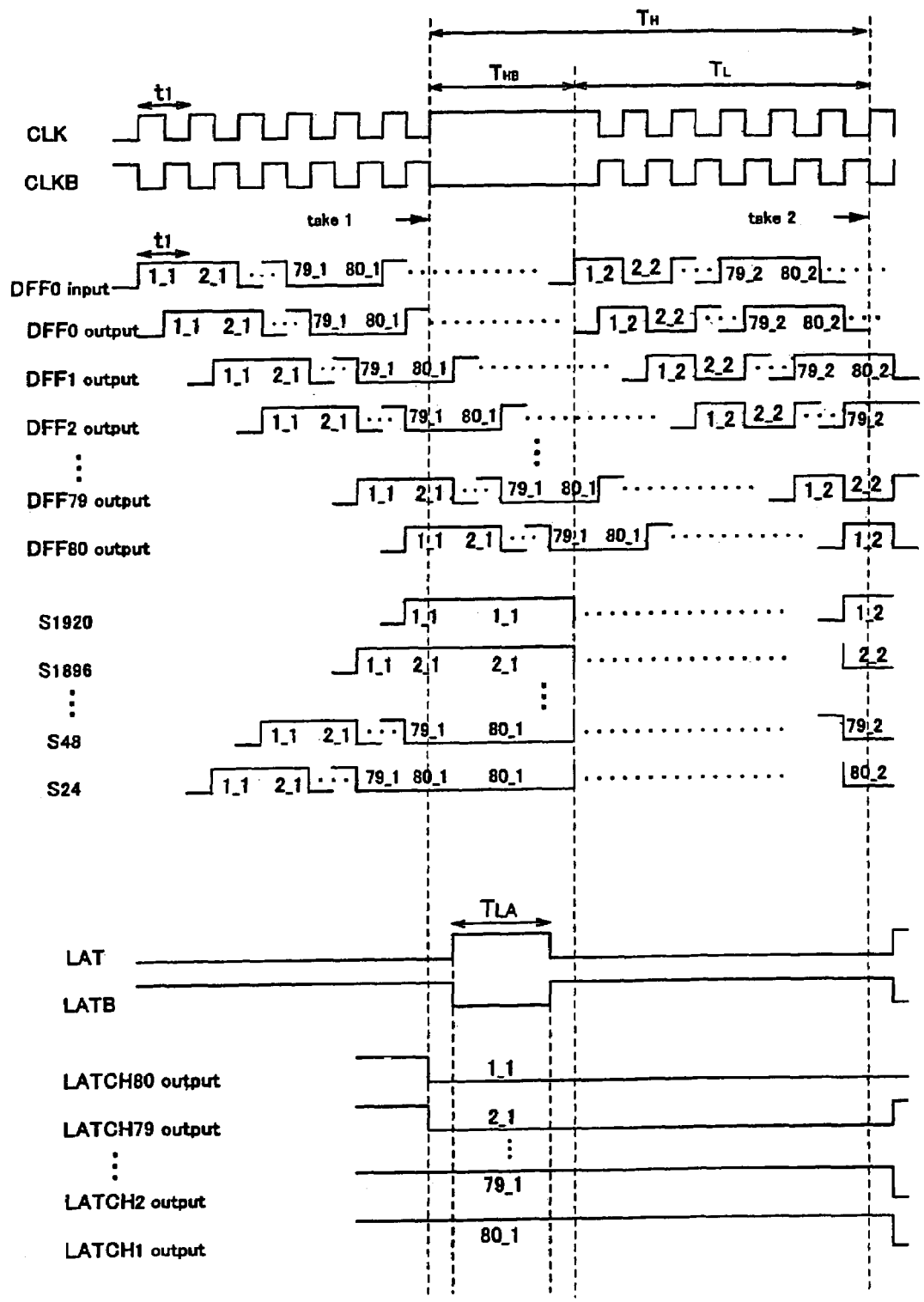
FIG. 7 is a timing chart of the digital driver according to Embodiment 1 of the invention.

Here, FIG. 7 will be referred to. FIG. 7 shows a timing chart explaining the operation of the shift register circuit and the latch circuits in the source driver according to this embodiment.

First, to the register circuit (DFF0) at the $0^{th}$ stage of the source driver, the clock signal (CLK), the clock-back signal (CLKB) and the digital data are inputted. To the register circuit DFF0, a first digital data (1_1), a second digital data (2_1), a third digital data (3_1), . . . , a $79^{th}$ digital data (79_1) and an $80^{th}$ digital data (80_1) are successively inputted (DFF0 input shown in FIG. 7).

The register circuit DFF0 successively shifts and outputs the inputted digital data (DFF0 output shown in FIG. 7) on the basis of these clock signal (CLK) and clock-back signal (CLKB), thus successively sending out the digital data to the register circuit DFF1 at the following stage. In this embodiment, t1=320 ns. Further, the DFF0 at the $0^{th}$ stage is a dummy register circuit as mentioned above, so that the output thereof is not directly inputted to any latch circuit.

To the register circuit DFF1 at the first stage, the digital data outputted from the DFF0 are successively inputted. The register circuit DFF1 successively shifts and outputs the inputted digital data (DFF1 output and S24 shown in FIG. 7) on the basis of the clock signal (CLK) and clock-back signal (CLKB), thus successively sending out the data to the register circuit DFF2 at the following stage.

To the register circuit DFF2 at the second stage, the digital data outputted from the DFF1 are successively inputted. The register circuit DFF2 successively shifts and outputs the inputted digital data (DFF2 output and S48 shown in FIG. 7) on the basis of the clock signal (CLK) and the clock-back signal (CLKB), thus successively sending out the digital data to the register circuit DFF3 at the following stage.

In this way, the digital data inputted to the register circuit DFF0 at the $0^{th}$ stage is shifted through the register circuits one after another on the basis of the clock signal (CLK) and the clock-back signal (CLKB) and, finally, becomes the output of the register circuit DFF80 at the final stage (the $80^{th}$ stage) (DFF80 output and S1920 shown in FIG. 7).

The period spent until the digital data (1_1) inputted to the register circuit DFF0 at the $0^{th}$ stage become the output of the register circuit DFF80 at the final stage is a line period ($T_L$); during this line period, the clock signal (CLK) and the clock-back signal (CLKB) are continuously fed to all the register circuits (DFF0 to DFF80). During the line period ($T_L$), the latch signal (LAT) and the latch-back signal (LATB) are controlled so that no digital data may be inputted to the latch circuits, as mentioned above.

Further, during a horizontal retrace line period ($T_{HB}$) between a line period ($T_L$) and the next line period ($T_L$), the oscillation of the clock signal (CLK) and the clock-back signal (CLKB) is stopped (See FIG. 7). By this measure, during the horizontal retrace line period ($T_{HB}$), the register circuits (DFF1 to DFF80) hold the outputs (S1 to Sn) of the digital data and outputs the digital data to the corresponding latch circuits (LATCH1 to LATCH80) through inverters 310 without fail.

The shift register circuit 300 according to this embodiment includes the dummy register circuit DFF0, so that the output of the register circuit DFF1 at the first stage is inputted to the first latch circuit LATCH1, the output of the register circuit DFF2 at the second stage is inputted to the second latch circuit LATCH2 at the second stage, and the output of the register circuit DFF80 at the $80^{th}$ stage is inputted to the $80^{th}$ latch circuit LATCH80.

During the horizontal retrace line period ($T_{HB}$), the latch signal (LAT) and the latch-back signal (LATB) are inputted within the latch period ($T_{LA}$), so that the respective latch circuits (LATCH1 to LATCH80) take in, through the inverters, the digital data held in the register circuits.

In this way, into all the latch circuits (LATCH1 to LATCH80), the digital data (80_1 to 1_1) are taken. Here, it is understood that the digital data (80_1 to 1_1) are taken into the latch circuits (LATCH80 to LATCH1) in the order in which the digital data are inputted. Thus, the latch circuits (LATCH1 to LATCH80) respectively output the digital data (80_1 to 1_1) (LATCH1 to LATCH80 outputs shown in FIG. 7).

After the termination of the horizontal retrace line period ($T_{HB}$), a line period ($T_L$) starts again, and thus, the oscillation of the clock signal (CLK) and the clock-back signal (CLKB) is resumed. Then, on the basis of the clock signal (CLK) and the clock-back signal (CLKB), the digital data (1_2 to 80_2) are serially inputted to the register circuit DFF0 at the $0^{th}$ stage.

Further, in this embodiment, $T_{HB}$=6.24 µs, and $T_H$=31.84 µs.

By repeating the above-mentioned operation, the digital data serially inputted can be outputted in parallel to the latch circuits array 320.

In this embodiment, the latch circuit array 201-2 comprises the aggregate of 12 stages of latch circuit arrays 320 corresponding to the respective bits.

During the horizontal retrace line period, the latch signal (LAT) and the latch-back signal (LATB) are inputted to the latch circuits. At this instant the data inputted in the respective latch circuits are written into all the stages of the latch circuit. During the one horizontal period before the next latch signal (LAT) and latch-back signal (LATB) are inputted, the digital data are held. During this one horizontal period during which the digital data are held, the data which are written in all the latch circuits of the latch circuit are successively selected by the selector circuits 1 and fed to the D/A converter circuits.

Each of the selector circuits (1) 201-3 is provided one for every four source signal lines; by the inputted phase signals (PHASE1, PHASE1B, PHASE 2, PHASE2B), the 6-bit digital data fed from the latch circuits corresponding to the four source signal lines are selected and outputted for every ¼ period (T1, T2, T3, T4) of one horizontal period. The 6-bit digital data selected by the selector circuits (1) 201-3 are fed to the D/A converter circuit 201-4.

The analog data outputted from the D/A converter circuit 201-4 comprises a voltage indicative of gradation (gradation voltage), which is selected by the selector circuit (2) 201-5 for every ¼ period of one horizontal period as in case of the above-mentioned selector circuit 1 and fed to the source signal lines.

The analog data fed to the source signal lines is fed to the picture elements connected to the selected gate signal line.

Embodiment 2

An example of the method for forming a liquid crystal display device which has a digital driver of the present invention is described in the present Embodiment by using FIGS. 8A to 12. A pixel section, a source driver, a gate driver or the like are integrally formed over a substrate in the liquid crystal display device of this Embodiment. Note that an n-channel TFT that forms pixel section and analog switches of the D/A converter, and a p-channel TFT and an n-channel that form inverter circuit are shown to be formed over a substrate, for the convenience of explanation.

Referring to FIG. 8A, a low-alkaline glass substrate or a quartz substrate can be used as a substrate 6001. In this embodiment, a low-alkaline glass substrate was used. In this case, a heat treatment at a temperature lower by about 10 to 20° C. than the strain point of glass may be performed in advance. On the surface of this substrate 6001 on which TFTs are to be formed, a base film 6002 such as a silicon oxide film, a silicon nitride film or a silicon oxynitride film is formed in order to prevent the diffusion of impurities from the substrate 6001. For example, a silicon oxynitride film which is fabricated from $SiH_4$, $NH_3$, $N_2O$ by plasma CVD into 100 nm thickness, and a silicon oxynitride film which is similarly fabricated from $SiH_4$ and $N_2O$ into 200 nm thickness are formed into a laminate.

Next, a semiconductor film 6003a that has an amorphous structure and a thickness of 20 to 150 nm (preferably, 30 to 80 nm) is formed by a known method such as plasma CVD or sputtering. In this embodiment, an amorphous silicon film was formed to a thickness of 54 nm by plasma CVD. As semiconductor films which have an amorphous structure, there are an amorphous semiconductor film and a microcrystalline semiconductor film; and a compound semiconductor film with an amorphous structure such as an amorphous silicon germanium film may also be applied. Further, the base film 6002 and the amorphous silicon film 6003a can be formed by the same deposition method, so that the two films can be formed in succession. By not exposing the base film to the atmospheric air after the formation of the base film, the surface of the base film can be prevented from being contaminated, as a result of which the dispersion in characteristics of the fabricated TFTs and the variation in the threshold voltage thereof can be reduced. (FIG. 8A)

Then, by a known crystallization technique, a crystalline silicon film 6003b is formed from the amorphous silicon film 6003a. For example, a laser crystallization method or a thermal crystallization method (solid phase growth method) may be applied, however, here, in accordance with the technique disclosed in Japanese Patent Laid-Open No. Hei 7-130652, the crystalline silicon film 6003b was formed by the crystallization method using a catalytic element. It is preferred that, prior to the crystallization step, heat treatment is carried out at 400 to 500° C. for about one hour though it depends on the amount of hydrogen contained, so that, after the amount of hydrogen contained is reduced to 5 atomic % or less, the crystallization is carried out. The atoms are subjected to re-configuration to become dense when an amorphous silicon film is crystallized; and therefore, the thickness of the crystalline silicon film fabricated is reduced by about 1 to 15% than the initial thickness of the amorphous silicon film (54 nm in this embodiment). (FIG. 8B)

Then, the crystalline silicon film 6003b is patterned into islands, whereby island semiconductor layers 6004 to 6007 are formed. Thereafter, a mask layer 6008 of a silicon oxide film is formed to a thickness of 50 to 150 nm by plasma CVD or sputtering. (FIG. 8C) The thickness of the mask layer 6008 is 130 nm in the present Embodiment.

Then, a resist mask 6009 is provided, and, into the whole surfaces of the island semiconductor layers 6004 to 6007 forming the n-channel TFTs, boron (B) was added as an impurity element imparting p-type conductivity, at a concentration of about $1\times10^{16}$ to $5\times10^{17}$ atoms/cm$^3$. The addition of boron (B) is performed for the purpose of controlling the threshold voltage. The addition of boron (B) may be performed either by the ion doping or it may be added simultaneously when the amorphous silicon film is formed. The addition of boron (B) here was not always necessary. (FIG. 8D)

In order to form the LDD regions of the n-channel TFTs in the driving circuit of the drivers, etc., an impurity element imparting n-type conductivity is selectively added to the island semiconductor layers 6010 and 6012. For this purpose, resist masks 6013 to 6016 were formed in advance. As the impurity element imparting the n-type conductivity, phosphorus (P) or arsenic (As) may be used; here, in order to add phosphorus (P), ion doping using phosphine (PH$_3$) was applied. The concentration of phosphorus (P) in the impurity regions 6017 and 6018 thus formed may be set within the range of from $2\times10^{16}$ to $5\times10^{19}$ atoms/cm$^3$. In this specification, the concentration of the impurity element contained in the thus formed impurity regions 6017 to 6019 imparting n-type conductivity is represented by (n$^-$). Further, the impurity region 6019 is a semiconductor layer for forming the storage capacitor of the pixel section, and phosphorus (P) was also added at the same concentration in this region. (FIG. 9A) Thereafter, resist masks 6013 to 6016 are removed.

Next, the mask layer 6008 is removed by hydrofluoric acid or the like, and the step of activating the impurity elements added at the steps shown in FIG. 8D and FIG. 9A is carried out. The activation can be carried out by performing heat treatment in a nitrogen atmosphere at 500 to 600° C. for 1 to 4 hours or by using the laser activation method. Further, both methods may be jointly performed. In this embodiment, the laser activation method was employed. A KrF excimer laser beam (with a wavelength of 248 nm) was used to form a linear beam. The shape of the laser light is formed into a linear beam in the present Embodiment and the linear beam of the oscillation frequency at 5 to 50 Hz and the energy density at 100 to 500 mJ/cm$^2$ is scanned with the overlap ratio of 80 to 98%, whereby the whole substrate surface on which the island semiconductor layers were formed are treated. Note that there is no limitation to the conditions for irradiating the laser light, and it can be appropriately determined.

Then, a gate insulating film 6020 is formed of an insulating film comprising silicon to a thickness of 10 to 150 nm, by plasma CVD or sputtering. For example, a silicon oxynitride film is formed to a thickness of 120 nm. As the gate insulating film, another insulating film comprising silicon may be used as a single layer or a laminate structure. (FIG. 9B)

Next, in order to form a gate electrode, a first conductive layer is deposited. This first conductive layer may be comprised of a single layer but may also be comprised of a laminate consisting of two or three layers. In this embodiment, a conductive layer (A) 6021 comprising a conductive metal nitride film and a conductive layer (B) 6022 comprising a metal film are laminated. The conductive layer (B) 6022 may be formed of an element selected from among tantalum (Ta), titanium (Ti), molybdenum (Mo) and tungsten (W) or an alloy comprised mainly of the above-mentioned element, or an alloy film (typically, a Mo—W alloy film or a Mo—Ta alloy film) comprised of a combination of the above-mentioned elements, while the conductive layer (A) 6021 comprises tantalum nitride (TaN), tungsten nitride (WN), titanium nitride (TiN), or molybdenum nitride (MoN). Further, as the substitute materials of the conductive film (A) 6021, tungsten silicide, titanium silicide, and molybdenum silicide may also be applied. The conductive layer (B) 6022 may preferably have its impurity concentration reduced in order to decrease the resistance thereof; in particular, as for the oxygen concentration, the concentration may be set to 30 ppm or less. For example, tungsten (W) could result in realizing a resistivity of 20 μΩcm or less by rendering the oxygen concentration thereof to 30 ppm or less.

The conductive layer (A) 6021 may be set to 10 to 50 nm (preferably, 20 to 30 nm), and the conductive layer (B) 6022 may be set to 200 to 400 nm (preferably, 250 to 350 nm). In this embodiment, as the conductive layer (A) 6021, a tantalum nitride film with a thickness of 50 nm was used, while, as the conductive layer (B) 6022, a Ta film with a thickness of 350 nm was used, both films being formed by sputtering. In the deposition by sputtering here, if a suitable amount of Xe or Kr is added into the sputtering gas Ar, the internal stress of the film formed is alleviated, whereby the film can be prevented from peeling off. Though not shown, it is effective to form a silicon film, into which phosphorus (P) is doped, to a thickness of about 2 to 20 nm underneath the conductive layer (A) 6021. By doing so, the adhesiveness of the conductive film formed thereon can be enhanced, and the oxidation can be prevented. At the same time, the alkali metal element slightly contained in the conductive layer (A) or the conductive layer (B) can be prevented from diffusing into the gate insulating film 6020. (FIG. 9C)

Next, resist masks 6023 to 6027 are formed, and the conductive layer (A) 6021 and the conductive layer (B) 6022 are etched together to form gate electrodes 6028 to 6031 and a capacitor wiring 6032. The gate electrodes 6028 to 6031 and the capacitor wiring 6032 are formed in such a manner that the layers 6028a to 6032a comprised of the conductive layer (A) and the layers 6028b to 6032b comprised of the conductive layer (B) are formed as one body respectively. In this case, the gate electrodes 6028 to 6030 which later form the driving circuit of the drivers, etc. are formed so as to overlap the portions of the impurity regions 6017 and 6018 through the gate insulating film 6020. (FIG. 9D)

Then, in order to form the source region and the drain region of the p-channel TFT in the driving circuit, the step of adding an impurity element imparting p-type conductivity is carried out. Here, by using the gate electrode 6028 as a mask, impurity regions are formed in a self-alignment manner. In this case, the region in which the n-channel TFT will be formed is covered with a resist mask 6033 in advance. Thus, impurity regions 6034 were formed by ion doping using diborane ($B_2H_6$). The concentration of boron (B) in this region is brought to $3 \times 10^{20}$ to $3 \times 10^{21}$ atoms/cm$^3$. In this specification, the concentration of the impurity element imparting p-type contained in the impurity regions 6034 is represented by ($p^{++}$). (FIG. 10A)

Next, impurity regions that functioned as source regions or drain regions were formed in the n-channel TFTs. Resist masks 6035 to 6037 were formed and an impurity element for imparting the n-type conductivity was added to form impurity regions 6038 to 6042. This was carried out by ion doping using phosphine ($PH_3$), and the phosphorus (P) concentration in these regions was set to $1 \times 10^{20}$ to $1 \times 10^{21}$ atoms/cm$^3$. In this specification, the concentration of the impurity element imparting the n-type contained in the impurity regions 6038 to 6042 formed here is denoted as ($n^+$). (FIG. 10B)

Though phosphorus (P) or boron (B) added in the preceding steps are contained in the impurity regions 6038 to 6042, phosphorus is added here at a sufficiently higher concentration compared to these, so that the influence by the phosphorus (P) or boron (B) added in the preceding steps need not be taken into consideration. Further, the concentration of phosphorus (P) that is added into the impurity regions 6038 is ½ to ⅓ of the concentration of the boron (B) added in the step shown in FIG. 10A; and thus, the p-type conductivity was secured, and no influence was exerted on the characteristics of the TFTs.

Then, the step of adding an impurity imparting n-type for forming the LDD regions of the n-channel TFTs in the pixel section was carried out. Here, by using the gate electrode 6031 as a mask, the impurity element imparting n-type was added in a self-alignment manner using ion doping. The concentration of phosphorus (P) added was $1 \times 10^{16}$ to $5 \times 10^{18}$ atoms/cm$^3$; by thus adding phosphorus in a concentration lower than the concentrations of the impurity elements added in the steps shown in FIGS. 9A, 10A and 10B, only impurity regions 6043 and 6044 were substantially formed. In this specification, the concentration of the impurity element imparting n-type contained in these impurity regions 6043 and 6044 is denoted as ($n^{--}$). (FIG. 10C)

SiON film or the like may be formed here to 200 nm thickness as an interlayer film, in order to prevent peeling of Ta of the gate electrode.

Thereafter, in order to activate the impurity elements, which were added at their respective concentrations for imparting n-type or p-type conductivity, a heat treatment step was carried out. This step can be carried out by furnace annealing, laser annealing or rapid thermal annealing (RTA). Here, the activation step was performed by furnace annealing. Heat treatment is carried out in a nitrogen atmosphere with an oxygen concentration of 1 ppm or less, preferably 0.1 ppm or less, at 400 to 800° C., typically at 500 to 600° C.; in this embodiment, the heat treatment was carried out at 500° C. for 4 hours. Further, in the case a heat resistant material such as a quartz substrate is used as the substrate 6001, the heat treatment may be carried out at 800° C. for one hour; in this case, the activation of the impurity elements and the junctions between the impurity regions into which the impurity element was added and the channel forming region could be well formed. Note that in the case the above stated interlayer film for preventing Ta peeling of the gate electrode is formed, this effect is not obtained in some cases.

By this heat treatment, on the metal films 6028b to 6032b, which form the gate electrodes 6028 to 6031 and the capacitor wiring 6032, conductive layers (C) 6028c to 6032c are formed with a thickness of 5 to 80 nm as measured from the surface. For example, in the case the conductive layers (B) 6028b to 6032b are made of tungsten (W), tungsten nitride (WN) is formed; in the case of tantalum (Ta), tantalum nitride (TaN) can be formed. Further, the conductive layers (C) 6028c to 6032c can be similarly formed by exposing the gate electrodes 6028 to 6031 and the capacitor wiring 6032 to a plasma atmosphere containing nitrogen which plasma atmosphere uses nitrogen or ammonia. Further, heat treatment was carried out in an atmosphere containing 3 to 100% of hydrogen at 300 to 450° C. for 1 to 12 hours, thus performing the step of hydrogenating the island semiconductor layers. This step is a step for terminating the dangling bonds of the semiconductor layers by the thermally excited hydrogen. As another means for the hydrogenation, plasma hydrogenation (using hydrogen excited by plasma) may be performed.

In the case the island semiconductor layers were fabricated by the crystallization method from an amorphous silicon film using a catalytic element, a trace amount of the catalytic element remained in the island semiconductor layers. Of course, it is possible to complete the TFT even in such a state however, it was more preferable to remove the residual catalytic element at least from the channel forming region. As one of the means for removing this catalytic element, there was the means utilizing the gettering function of phosphorus (P). The concentration of phosphorus (P) necessary to perform gettering is at the same level as that of the impurity region ($n^+$) which was formed in the step shown in FIG. 10B; by the heat treatment in the activation step carried out here, the catalytic element could be gettered from the channel forming regions of the n-channel TFTs and the p-channel TFTs. (FIG. 10D)

A first interlayer insulating film 6045 is formed of a silicon oxide film or a silicon oxynitride film with a thickness of 500 to 1500 nm, and contact holes reaching the source regions or the drain regions, which are formed in the respective island semiconductor layers, are formed; and source wirings 6046 to 6049 and drain wirings 6050 to 6053 are formed. (FIG. 11A) Though not shown, in this embodiment, these electrodes were formed from a laminate of three-layer structure which was constituted by continuously forming by sputtering a Ti film with a thickness of 100 nm, an aluminum film containing Ti and having a thickness of 500 nm, and a Ti film with a thickness of 150 nm.

Figure 11A:
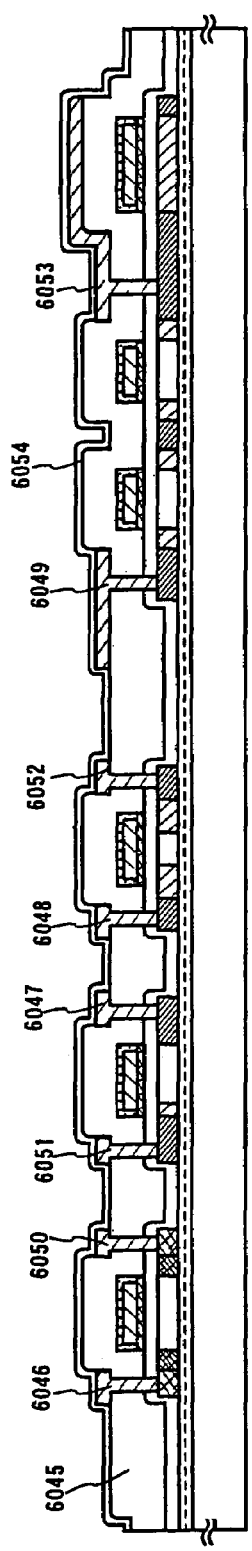
FIGS. 11A and 11B show diagrams explaining still other steps of manufacturing a liquid crystal display device including the digital driver according to Embodiment 2 of the invention.

Next, as a passivation film 6054, a silicon nitride film, a silicon oxide film or a silicon oxynitride film is formed to a thickness of 50 to 500 nm (typically, 100 to 300 nm). The passivation film 6054 is a laminate film of 50 nm thickness silicon nitride film and 24.5 nm silicon oxide film. In the case that a hydrogenating treatment was carried out in this state, a desirable result was obtained in respect of the enhancement in characteristics of the TFTs. For example, it is preferable to carry out heat treatment in an atmosphere containing 3 to 100% of hydrogen at 300 to 450° C. for 1 to 12 hours; or, in the case that the plasma hydrogenation method was employed, a similar effect was obtained. Here, openings may be formed in the passivation film 6054 at the positions at which contact holes for connecting the pixel electrodes and drain wirings to each other will be formed later. (FIG. 11A)

Figure 11B:
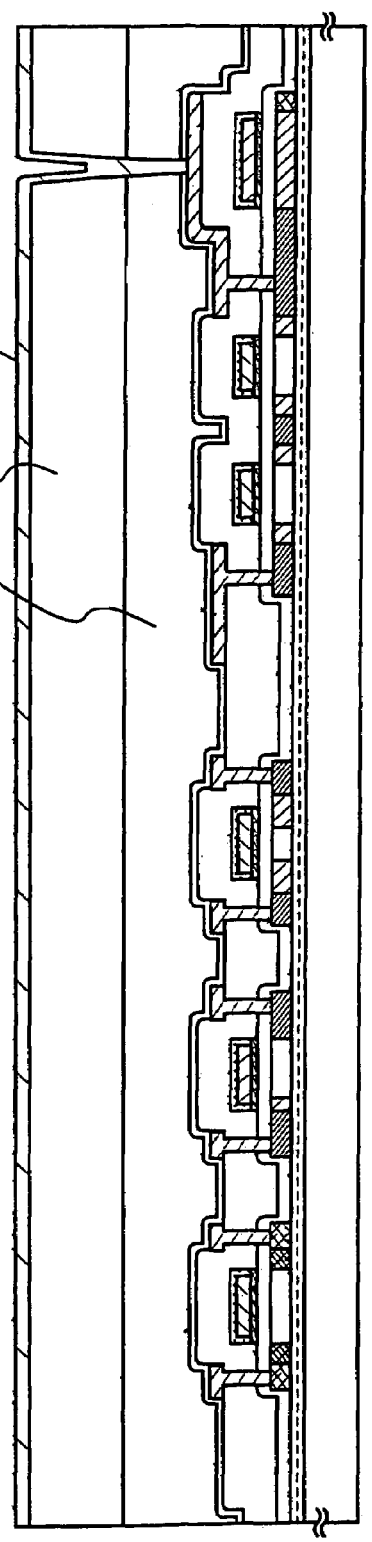

Thereafter, a second interlayer insulating film 6055 comprised of an organic resin is formed to a thickness of 1.0 to 1.5 μm. As the organic resin, polyimide, acrylic, polyamide, polyimideamide, or BCB (benzocyclobutene), etc. can be used. Here, acrylic of the type that, after applied to the substrate, thermally polymerizes was used; it was fired at 250° C., whereby the second interlayer insulating film was formed. (FIG. 11B)

Here, a capacitor for a D/A converter circuit is formed. An electrode that will become an electrode of the capacitor for the D/A converter circuit is formed in the same wiring layer as the drain wiring. All of the second interlayer insulating film 6055 that exists over the electrode is removed (not shown). Black matrix is then formed (not shown). In the present embodiment black matrix is a laminate structure forming Ti film into 100 nm, and then forming alloy film of Al and Ti into 300 nm. Accordingly a capacitor of a D/A converter is formed in the present Embodiment between the above stated electrode and the black matrix.

Thereafter a third interlayer insulating film 6059 comprising organic resin is formed into 1.0 to 1.5 μm thick. A resin similar to that of the second interlayer insulating film can be used as the organic resin. Here a polyimide of a type that thermally polymerizes after applying onto the substrate is used and formed by firing at 300° C.

Then, a contact hole reaching the drain wiring 6053 was formed in the second interlayer insulating film 6055 and the third interlayer insulating film 6059, and pixel electrode 6060 was formed. The pixel electrode 6060 uses a metallic film in the reflection type liquid crystal display device of the present invention. In the present Embodiment it is formed into a laminate structure in which Ti film is formed into 300 nm and then an alloy film of Al and Ti is formed into 100 nm. (FIG. 11B)

In this way, a substrate having the TFTs of the driving circuit and the pixel TFTs of the pixel section on the same substrate can be completed. In the driving circuit, there were formed a p-channel TFT 6101, a first n-channel TFT 6102 and a second n-channel TFT 6103, while, in the pixel portion, there were formed a pixel TFT 6104 and a storage capacitor 6105. (FIG. 12) In this specification, such a substrate is called an active matrix substrate for convenience.

The processes for manufacturing a reflection type liquid crystal display device from an active matrix substrate manufactured through the above stated processes are described.

Figure 12:
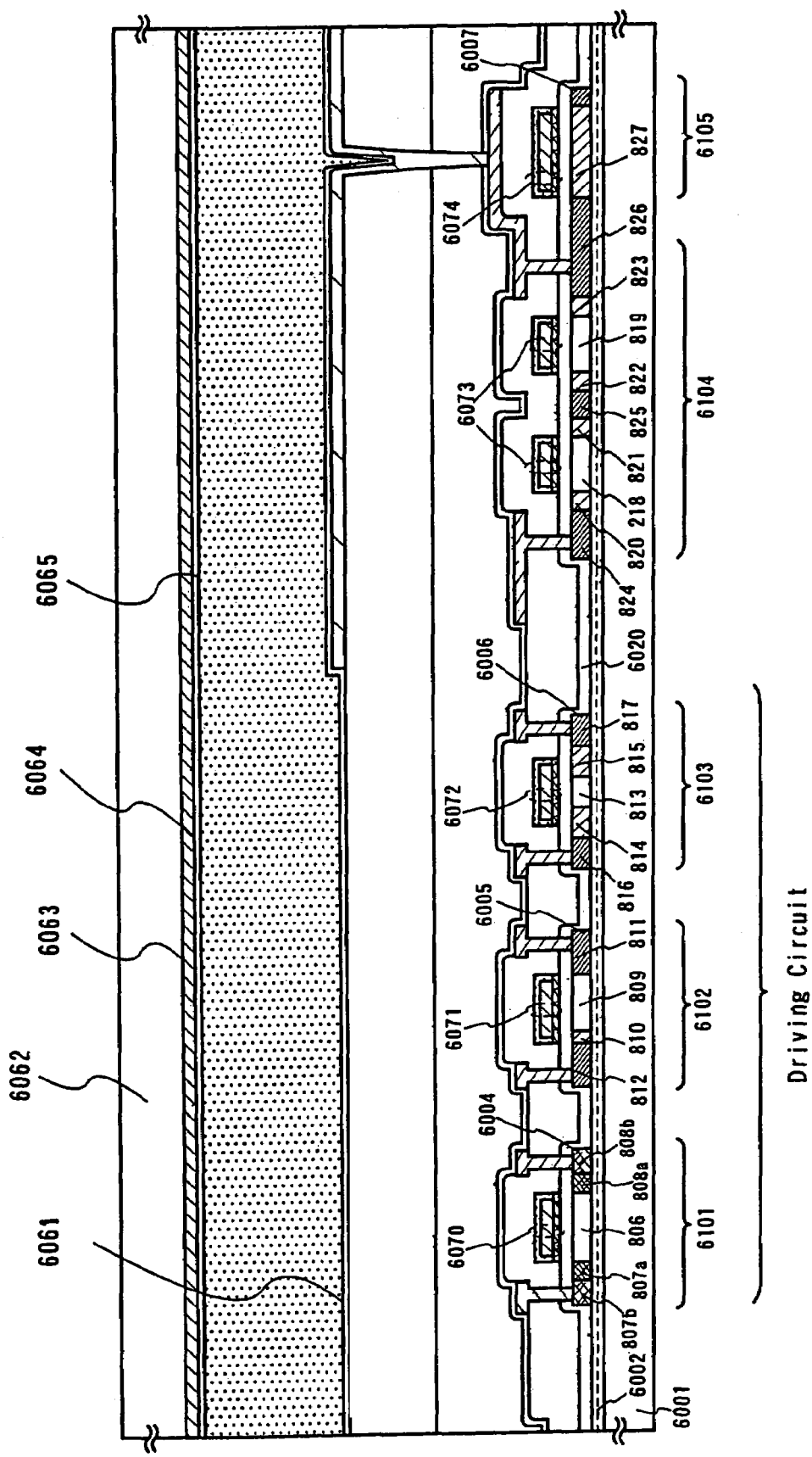
FIG. 12 is a diagram showing still another step of manufacturing a liquid crystal display device including the digital driver according to Embodiment 2.

An alignment film 6061 is formed onto the active matrix substrate of the state of FIG. 12. Polyimide is used in the present Embodiment for an alignment film 6061. An opposing substrate is next prepared. The opposing substrate comprises a glass substrate 6062, an opposing electrode 6063 comprising transparent conductive film and an alignment film 6064.

Polyimide film was used that orients liquid crystal molecules parallel with respect to the substrate as the alignment film in the present Embodiment. By performing rubbing treatment after forming the alignment film, the liquid crystals are made to orient in parallel having a certain pre-tilt angle.

The active matrix substrate that went through the above processes, and the opposing substrate are stuck together by a sealant or spacers (neither shown in the figure) through a known cell assembly process. Liquid crystal 6065 is then injected between the substrates and completely sealed by a sealant (not shown). A reflection type liquid crystal display device shown in FIG. 12 is thus complete.

Note that in the present Embodiment a reflection type liquid crystal display device is made to display by TN (twist) mode. Therefore a polarizing plate (not shown) is disposed over the reflection type liquid crystal display device.

The p-channel TFT 6101 in the driving circuit has a channel forming region 806, source regions 807a and 807b and drain regions 808a and 808b in the island semiconductor layer 6004. The first n-channel TFT 6102 has a channel forming region 809, a LDD region 810 overlapping the gate electrode 6071 (such a LDD region will hereinafter be referred to as Lov), a source region 811 and a drain region 812 in the island semiconductor layer 6005. The length in the channel direction of this Lov region is set to 0.5 to 3.0 μm, preferably 1.0 to 1.5 μm. A second n-channel TFT 6103 has a channel forming region 813, LDD regions 814 and 815, a source region 816 and a drain region 817 in the island semiconductor layer 6006. As these LDD regions, there are formed an Lov region and a LDD region which does not overlap the gate electrode 6072 (such a LDD region will hereafter be referred to as Loff); and the length in the channel direction of this Loff region is 0.3 to 2.0 μm, preferably 0.5 to 1.5 μm. The pixel TFT 6104 has channel forming regions 818 and 819, Loff regions 820 to 823, and source or drain regions 824 to 826 in the island semiconductor layer 6007. The length in the channel direction of the Loff regions is 0.5 to 3.0 μm, preferably 1.5 to 2.5 μm. Further, offset regions (not shown) are formed between channel forming regions 818 and 819 of the pixel TFT 6104 and the Loff regions 820 to 823 that are LDD regions of the pixel TFT. Further, the storage capacitor 805 comprises: capacitor wiring 6074; an insulator film composed of the same material as the gate insulator film 6020; and a semiconductor layer 827 which is connected to the drain region 826 of the pixel TFT 6073 and in which an impurity element for imparting the n-type conductivity is added. In FIG. 12, the pixel TFT 804 is of the double gate structure, but may be of the single gate structure, or may be of a multi-gate structure in which a plurality of gate electrodes are provided.

As described above, in this embodiment, the structure of the TFTs constituting the respective circuits can be optimized in accordance with the specifications required by the pixel TFTs and the drivers; and thus, the operating performance and the reliability of the liquid crystal display device can be enhanced.

Note that description is made in the present Embodiment with respect to reflection type liquid crystal display devices. However, a liquid crystal display device that can use the digital driver of the present invention is not limited to these, and it is possible to use in transmission type liquid crystal display devices.

Embodiment 3

It is possible to use a variety of liquid crystal materials other than TN liquid crystals in a liquid crystal display device manufactured in accordance with the above stated Embodiment. For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841, 1997; S. Inui et al., "Thresholdless antiferroelectricity in Liquid Crystals and its Application to Displays", J. Mater. Chem. 6(4), 671-673, 1996; and in U.S. Pat. No. 5,594,569 can be used.

A liquid crystal that shows antiferroelectric phase in a certain temperature range is called an antiferroelectric liquid crystal. Among a mixed liquid crystal comprising antiferroelectric liquid crystal material, there is one called thresholdless antiferroelectric mixed liquid crystal that shows electro-optical response characteristic in which transmittivity is continuously varied against electric field. Among the thresholdless antiferroelectric liquid crystals, there are some that show V-shaped electro-optical response characteristic, and even liquid crystals whose driving voltage is approximately 2.5 V (cell thickness approximately 1□m to 2□m) are found.

Figure 13:
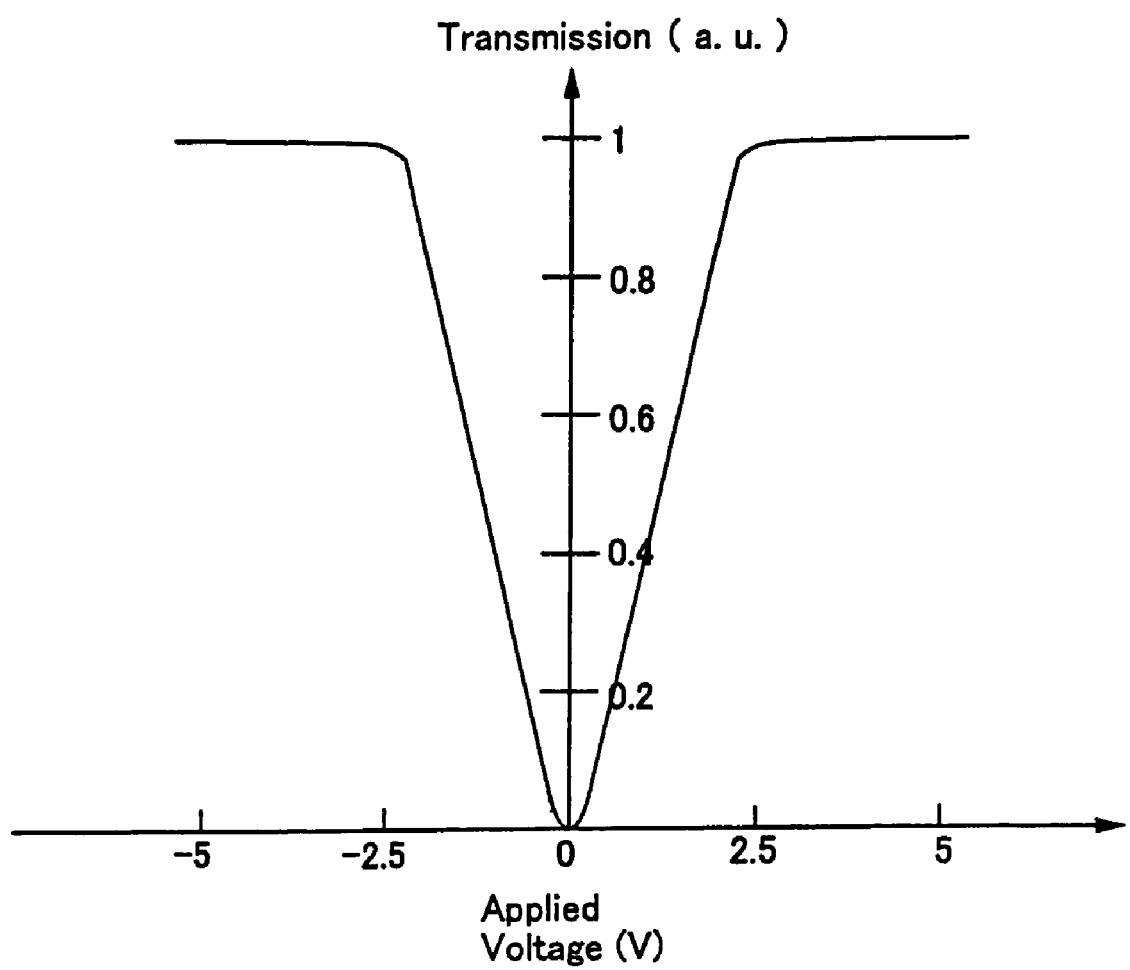
FIG. 13 is a graph showing the applied voltage-transmission factor characteristic of an antiferroelectric liquid crystal which exhibits a V-shaped electrooptical characteristic.

An example of light transmittivity characteristic against the applied voltage of thresholdless antiferroelectric mixed liquid crystal showing V-shaped electro-optical response characteristic, is shown in FIG. 13. The axis of ordinate in the graph shown in FIG. 13 is transmittivity (arbitrary unit) and the axis of the abscissas is the applied voltage. The transmitting axis of the polarizer on light incident side of the liquid crystal display device is set at approximately parallel to direction of a normal line of the smectic layer of thresholdless antiferroelectric liquid crystal that approximately coincides with the rubbing direction of the liquid crystal display device. Further, the transmitting axis of the polarizer on the light radiating side is set at approximately right angles (crossed Nicols) against the transmitting axis of the polarizer on the light incident side.

As shown in FIG. 13, it is shown that low voltage driving and gray scale display is available by using such thresholdless antiferroelectric mixed liquid crystal.

Further, in case of using the low voltage driving thresholdless antiferroelectric mixed liquid crystal to a liquid crystal display device having a digital driver, the operation power supply voltage of the D/A converter circuit can be lowered because the output voltage of the D/A converter circuit can be lowered, and the operation power voltage of the driver can be lowered. Accordingly, low consumption electricity and high reliability of the liquid crystal display device can be attained.

Therefore the use of such low voltage driving thresholdless antiferrelectric mixed liquid crystal is effective in case of using a TFT having a relatively small LDD region (low concentration impurity region) width (for instance 0 to 500 nm, or 0 to 200 nm).

Further, thresholdless antiferroelectric mixed liquid crystal has large spontaneous polarization in general, and the dielectric constant of the liquid crystal itself is large. Therefore, comparatively large storage capacitor is required in the pixel in case of using thresholdless antiferroelectric mixed liquid crystal for a liquid crystal display device. It is therefore preferable to use thresholdless antiferroelectric mixed liquid crystal having small spontaneous polarity. It is also acceptable to compensate a small storage capacitor by lengthening a writing period of gray scale voltage to the pixel (pixel field period) by applying line sequential driving method as the driving method of the liquid crystal panel.

A low consumption electricity of a liquid crystal display device is attained because low voltage driving is realized by the use of such thresholdless antiferroelectric mixed liquid crystal.

Embodiment 4

Any display can be applied as a display medium of the display device having digital driver of the present invention on condition that the electro-optical properties change by the applied voltage or applied electric current.

Embodiment 5

Examples of an electronic appliance incorporating a liquid crystal display device having a digital driver of the invention as a display device are given.

The following can be given as examples of this type of electronic appliances: video cameras; digital cameras; projectors (rear type or front type); head mounted displays (goggle type displays); car navigation systems; personal computers; portable information terminals (such as mobile computers, portable telephones or electronic notebooks). Some examples of these are shown in FIGS. 14A to 14F.

Figure 14A:
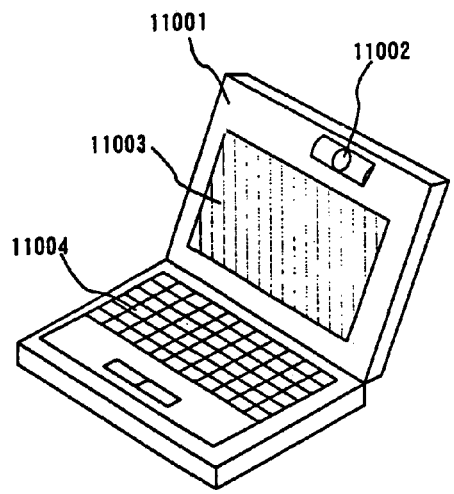
FIGS. 14A and 14F show examples of the electronic appliances each including a liquid crystal display device using the digital driver according to the invention.

FIG. 14A is a personal computer, which comprises: a main body 11001; an image input section 11002; a liquid crystal display device having digital driver of the invention 11003; and a keyboard 2004.

Figure 14B:
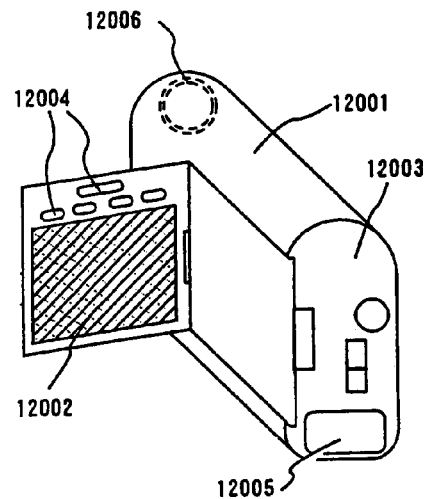

FIG. 14B is a video camera, which comprises: a main body 12001; a liquid crystal display device having digital driver of the invention 12002; a voice input section 12003; operation switches 12004; a battery 12005; and an image receiving section 12006.

Figure 14C:
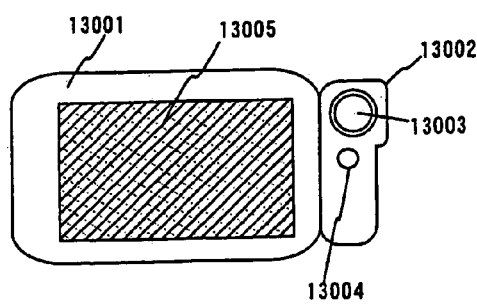

FIG. 14C is a mobile computer, which comprises: a main body 13001; a camera section 13002; an image receiving section 13003; operation switches 13004; and a liquid crystal display device having digital driver of the invention 13005.

Figure 14D:
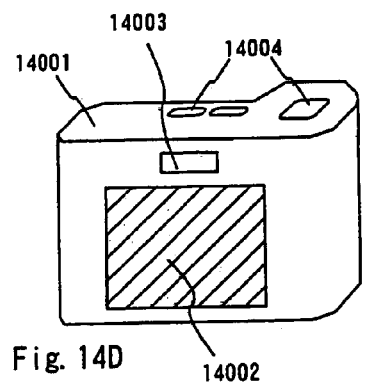

FIG. 14D is a digital camera, which comprises: a main body 14001; a liquid crystal display device having digital driver of the invention 14002; a view finder section 14003; operation switches 14004; and an image receiving section (not shown in the figure).

Figure 14E:
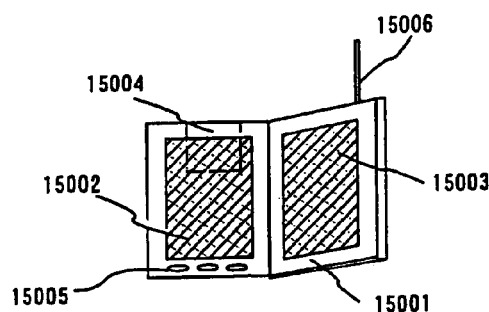

FIG. 14E is a portable book (electronic book), which comprises a main body 15001; a liquid crystal display devices having digital driver of the invention 15002 and 15003; a memory medium 15004; operation switches 15005; and an antenna 15006.

Figure 14F:
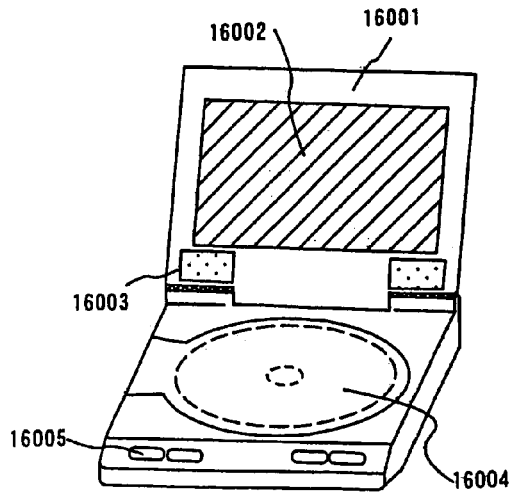
Figure 15:
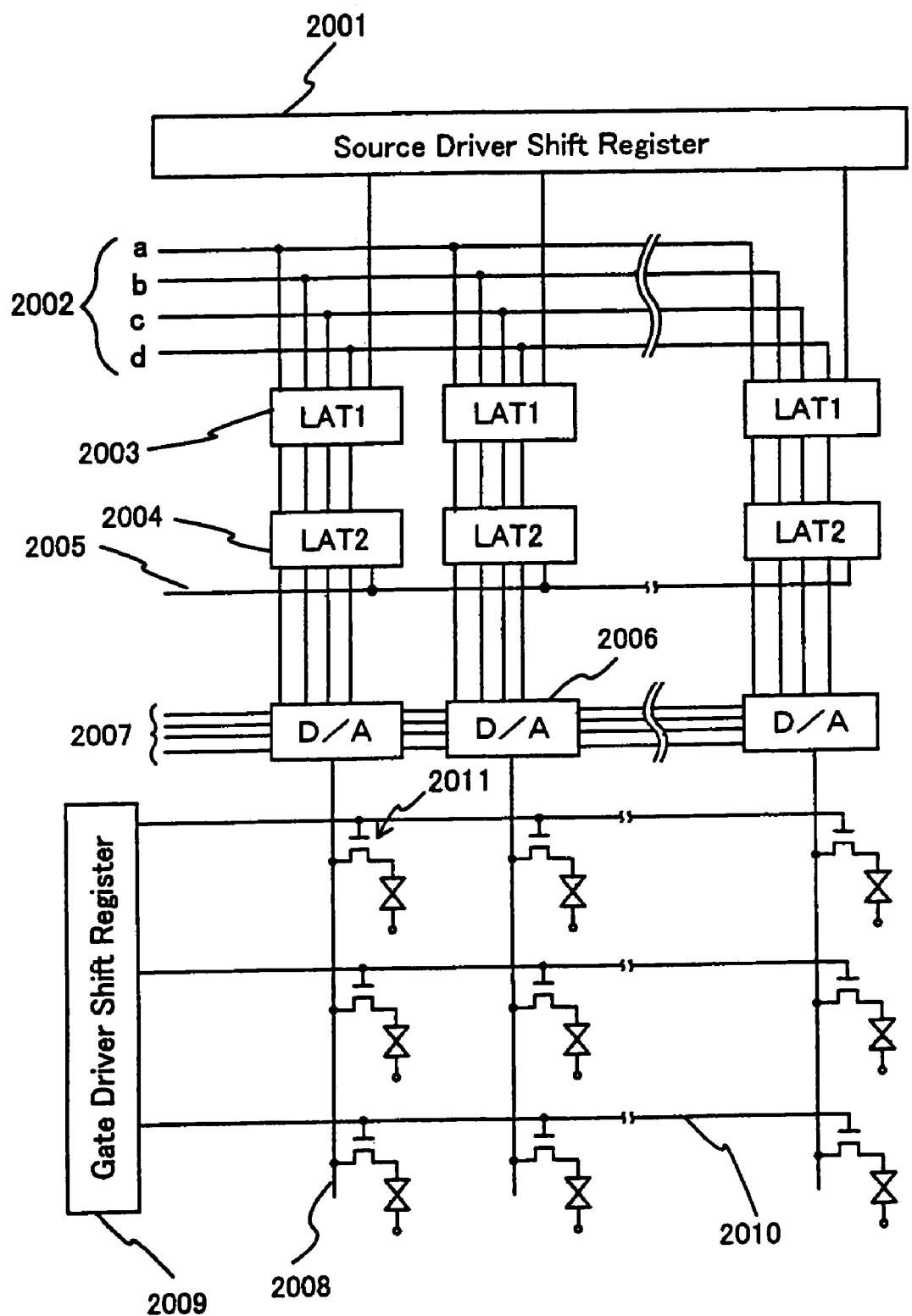
FIG. 15 is a schematic diagram showing a liquid crystal display device including a known digital driver.

FIG. 14F is a player that uses a recording medium on which an image or a program is recorded (hereinafter referred to as a recording medium), which comprises: a main body 16001; a liquid crystal display device having digital driver of the invention 16002; a speaker section 16003; a recording medium 16004; and operation switches 16005 etc. Note that music appreciation, film appreciation, games, and the use of the Internet can be performed with this device using a DVD (digital versatile disk), a CD, etc., as a recording medium.

Figure 16A:
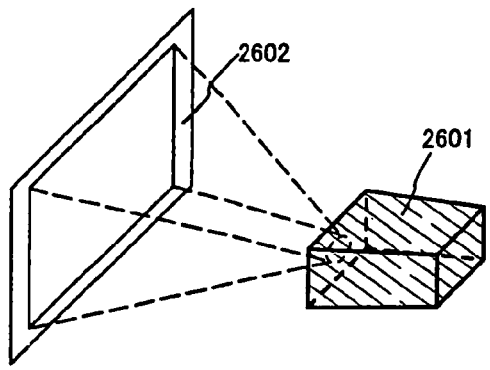
FIGS. 16A-16D show examples of the electronic appliances which each include a liquid crystal display device using the digital driver according to the invention.

FIG. 16A is a front projector which comprises a projection device 2601 and a screen 2602, etc. The present invention can be applied to the liquid crystal display device 2808 that constitutes a part of the projection device 2601 or other signal controlling circuits.

Figure 16B:
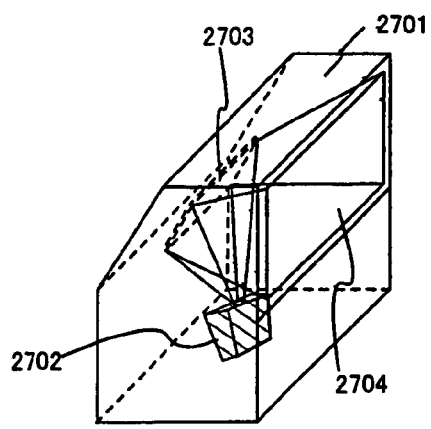

FIG. 16B is a rear projector which comprises: a main body 2701, a projection device 2702, a mirror 2703 and a screen 2704, etc. The present invention can be applied to the liquid crystal display device 2808 that constitutes a part of the projection device 2702 or other signal controlling circuits.

Figure 16C:
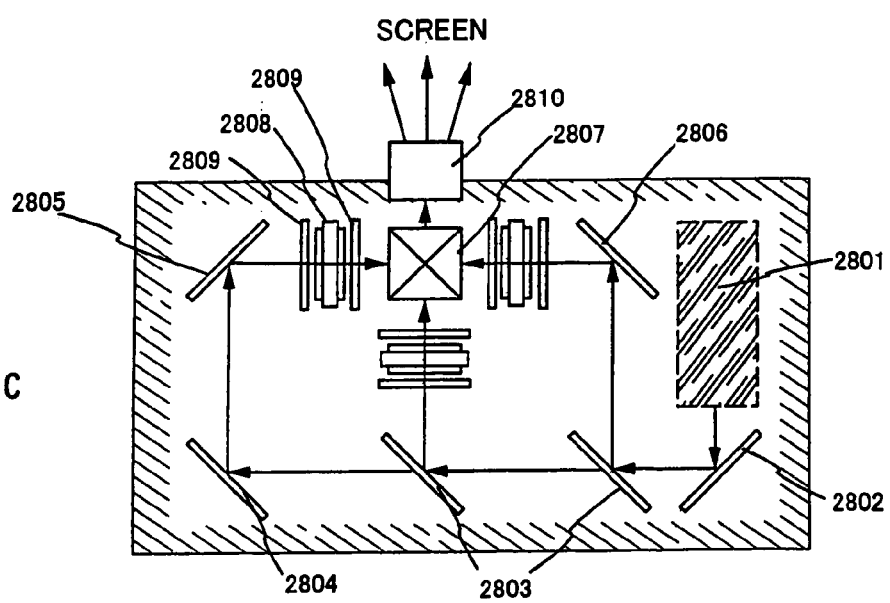

FIG. 16C is a diagram showing an example of the structure of the projection devices 2601 and 2702 in FIGS. 16A and 16B. The projection devices 2601 and 2702 comprise: an optical light source system 2801; mirrors 2802 and 2804 to 2806; a dichroic mirror 2803; a prism 2807; a liquid crystal display device 2808; a phase differentiating plate 2809; and a projection optical system 2810. The projection optical system 2810 comprises an optical system including projection lens. Though the present embodiment shows an example of 3-plate type, it is not limited to the 3-plate type, for example, single plate type is appropriate. Further, an operator may properly dispose an optical lens, a film having light polarizing function, a film adjusting phase difference, IR films and so forth in the optical path shown by an arrow in FIG. 16C.

Figure 16D:
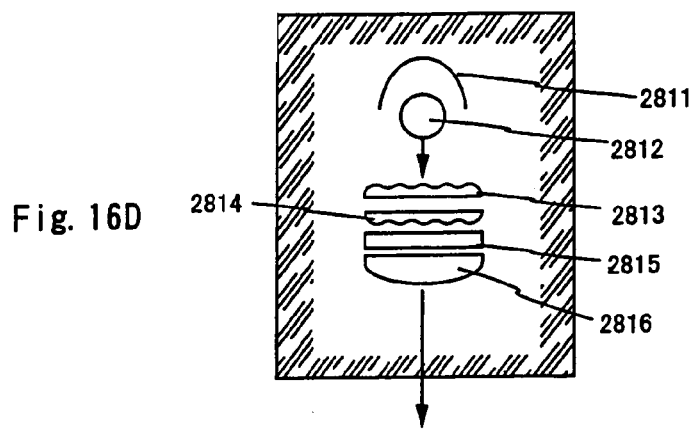

FIG. 16D is a diagram showing an example of the structure of the optical light source system 2801 in FIG. 16C. In the present embodiment the optical light source system 2801 comprises: a reflector 2811; a light source 2812; lens arrays 2813 and 2814; light polarizing conversion element 2815; and a condenser lens 2816. Note that the optical light source system shown in FIG. 16D is merely an example and the structure is not specifically limited. For example, an operator may properly dispose an optical lens, a film having light polarizing function, a film adjusting phase difference, IR films and so forth in the optical light source system.

Note that the projectors of FIGS. 16A and 16B show cases of using transmission type electro-optical device, and application examples of reflection type electro-optical device and EL display device are not shown in the figures.

Figure 17A:
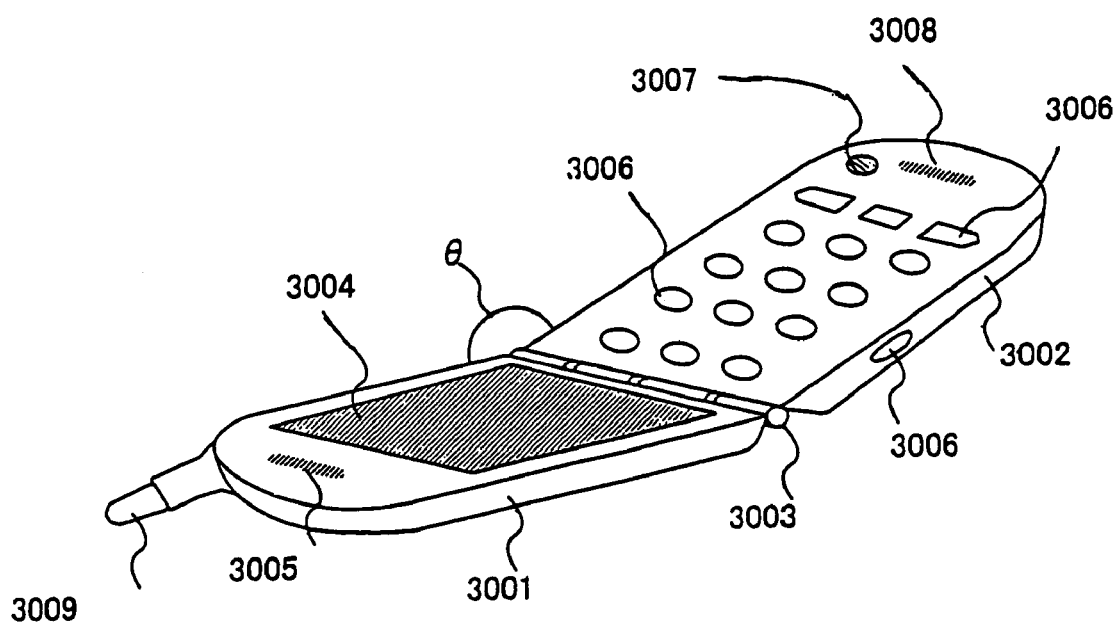
FIGS. 17A and 17B show examples of the electronic appliances which each include a liquid crystal display device using the digital driver according to the invention.

FIG. 17A is a portable telephone and reference numeral 3001 denotes a display panel and 3002 denotes an operation panel. The display panel 3001 and the operation panel 3002 are connected in the connecting section 3003. The angle θ between the plane on which display section 3004 of the display panel 3001 is disposed, and the plane on which operation keys 3006 of the operation panel 3002 are disposed can be arbitrarily changed.

Further, it has a voice output section 3005, operation keys 3006, electric power switch 3007 and voice input section 3008. The invention can be applied to the display section 3004 or other signal controlling circuits.

Figure 17B:
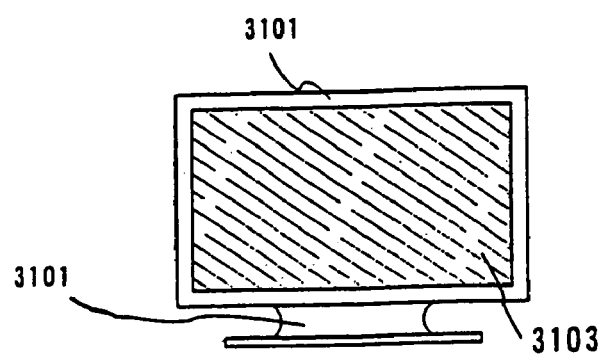

FIG. 17B is a display, which comprises a main body 3101, a support stand 3102 and a display section 3103, etc. The invention can be applied to the display section 3103. The display of the invention is specifically advantageous in the case of a large display, and it is advantageous in a display having a diagonal exceeding 10 inches (specifically a display having a diagonal exceeding 30 inches).

As described above, the applicable range of the liquid crystal display device having digital driver of the invention is very large, and it is possible to apply to electronic appliances of various areas.

In the digital driver according to the present invention, the digital data are directly inputted to the shift register, so that the distance over which the data lines are laid around can be shortened; and thus, the increase in load due to the laying-around of the data lines which has so far been a problem to be overcome can be prevented, and the delay of the digital data and the extended transition time of the digital data can be prevented. Therefore, the display devices each using the digital driver according to the present invention can perform good display.

What is claimed is:

1. A display device comprising:
a main body;
a support stand; and
a display section, the display section comprising:
a shift register circuit including a plurality of register circuits;
a latch circuit array including a plurality of latch circuits;
a first selector circuit electrically connected to the latch circuit array for selecting data fed from the latch circuit array;
a D/A converter circuit electrically connected to the first selector circuit; and
a second selector circuit electrically connected to the D/A converter circuit,
wherein digital data is inputted to the shift register circuit,
wherein the digital data successively shifts through the plurality of register circuits, and
wherein the shift register circuit is electrically connected to the plurality of latch circuits.

2. A display device comprising:
a main body;
a support stand; and
a display section, the display section comprising:
a shift register circuit including a register circuit at a first stage, a register circuit at a second stage, . . . , a register circuit at a $(n-1)^{th}$ stage and a register circuit at a $n^{th}$ stage (wherein n stands for a natural number); and
a latch circuit array including a first latch circuit, a second latch circuit, . . . , an $(n-1)^{th}$ latch circuit and an $n^{th}$ latch circuit,
wherein a first digital data, a second digital data, . . . , an $(n-1)^{th}$ digital data and an $n^{th}$ digital data are successively inputted to the register circuit at the first stage,
wherein output of the register circuit at the first stage, output of the register circuit at the second stage, . . . , output of the register circuit at the $(n-1)^{th}$ stage and output of the register circuit at the $n^{th}$ stage are respectively sent out to the first latch circuit, the second latch circuit, . . . , the $(n-1)^{th}$ latch circuit and the $n^{th}$ latch circuit, and
wherein when the first digital data is inputted to the register circuit at the $n^{th}$ stage, oscillation of a clock signal inputted to the shift register circuit stops, and the $n^{th}$ digital data, the $(n-1)^{th}$ digital data, . . . , the second digital data and the first digital data which are respectively held in the register circuit at the first stage, the register circuit at the second stage, . . . , the register circuit at the $(n-1)^{th}$ stage and the register circuit at the $n^{th}$ stage are respectively read into the first latch circuit, the second latch circuit, . . . , the $(n-1)^{th}$ latch circuit and the $n^{th}$ latch circuit.

3. A display device comprising:
a main body;
a support stand; and
a display section, the display section comprising:
TFTs disposed in a matrix;
a source driver; and
a gate driver, wherein the source driver comprises a shift register circuit which includes a plurality of register circuits, a latch circuit array which includes a plurality of latch circuits and is electrically connected to the shift register circuit, a first selector circuit electrically connected to the latch circuit array for selecting data fed from the latch circuit array, a D/A converter circuit electrically connected to the first selector circuit, and a second selector circuit electrically connected to the D/A converter circuit, and wherein digital data successively shifts through the plurality of register circuits.

4. A display device comprising:
a main body;
a support stand; and
a display section, the display section comprising:
TFTs disposed in a matrix;
a source driver; and
a gate driver,
wherein the source driver comprises a shift register circuit which includes a register circuit at a first stage, a register circuit at a second stage, ..., a register circuit at a $(n-1)^{th}$ stage and a register circuit at a $n^{th}$ stage (wherein n stands for a natural number) and a latch circuit array which includes a first latch circuit, a second latch circuit, ..., an $(n-1)^{th}$ latch circuit and an $n^{th}$ latch circuit, wherein first digital data, second digital data, ..., $(n-1)^{th}$ digital data and $n^{th}$ digital data are successively inputted to the register circuit at the first stage, wherein output of the register circuit at the first stage, output of the register circuit at the second stage, ..., output of the register circuit at the $(n-1)^{th}$ stage and output of the register circuit at the $n^{th}$ stage are respectively sent out to the first latch circuit, the second latch circuit, ..., the $(n-1)^{th}$ latch circuit and the $n^{th}$ latch circuit, and wherein when the first digital data is inputted to the register circuit at the $n^{th}$ stage, oscillation of a clock signal inputted to the shift register circuit stops, so that the $n^{th}$ digital data, the $(n-1)^{th}$ digital data, ..., the second digital data and the first digital data which are respectively held in the register circuit at the first stage, the register circuit at the second stage, ..., the register circuit at the $(n-1)^{th}$ stage and the register circuit at the $n^{th}$ stage are respectively taken into the first latch circuit, the second latch circuit, ..., the $(n-1)^{th}$ latch circuit and the $n^{th}$ latch circuit.

5. The display device according to claim 1, wherein the display device is a liquid crystal display device.

6. The display device according to claim 2, wherein the display device is a liquid crystal display device.

7. The display device according to claim 3, wherein the display device is a liquid crystal display device.

8. The display device according to claim 4, wherein the display device is a liquid crystal display device.

9. A portable telephone comprising:
a voice input section;
a voice output section;
operation keys; and
a display device, the display device comprising:
a shift register circuit including a plurality of register circuits;
a latch circuit array including a plurality of latch circuits;
a first selector circuit electrically connected to the latch circuit array for selecting data fed from the latch circuit array;
a D/A converter circuit electrically connected to the first selector circuit; and
a second selector circuit electrically connected to the D/A converter circuit,
wherein digital data is inputted to the shift register circuit,
wherein the digital data successively shifts through the plurality of register circuits, and
wherein the shift register circuit is electrically connected to the plurality of latch circuits.

10. A portable telephone comprising:
a voice input section;
a voice output section;
operation keys; and
a display device, the display device comprising:
a shift register circuit including a register circuit at a first stage, a register circuit at a second stage, ..., a register circuit at a $(n-1)^{th}$ stage and a register circuit at a $n^{th}$ stage (wherein n stands for a natural number); and
a latch circuit array including a first latch circuit, a second latch circuit, ..., an $(n-1)^{th}$ latch circuit and an $n^{th}$ latch circuit,
wherein a first digital data, a second digital data, ..., an $(n-1)^{th}$ digital data and an $n^{th}$ digital data are successively inputted to the register circuit at the first stage,
wherein output of the register circuit at the first stage, output of the register circuit at the second stage, ..., output of the register circuit at the $(n-1)^{th}$ stage and output of the register circuit at the $n^{th}$ stage are respectively sent out to the first latch circuit, the second latch circuit, ..., the $(n-1)^{th}$ latch circuit and the $n^{th}$ latch circuit, and
wherein when the first digital data is inputted to the register circuit at the $n^{th}$ stage, oscillation of a clock signal inputted to the shift register circuit stops, and the $n^{th}$ digital data, the $(n-1)^{th}$ digital data, ..., the second digital data and the first digital data which are respectively held in the register circuit at the first stage, the register circuit at the second stage, ..., the register circuit at the $(n-1)^{th}$ stage and the register circuit at the $n^{th}$ stage are respectively read into the first latch circuit, the second latch circuit, ..., the $(n-1)^{th}$ latch circuit and the $n^{th}$ latch circuit.

11. A portable telephone comprising:
a voice input section;
a voice output section;
operation keys; and
a display device, the display device comprising:
TFTs disposed in a matrix;
a source driver; and
a gate driver,
wherein the source driver comprises a shift register circuit which includes a plurality of register circuits, a latch circuit array which includes a plurality of latch circuits and is electrically connected to the shift register circuit, a first selector circuit electrically connected to the latch circuit array for selecting data fed from the latch circuit array, a D/A converter circuit electrically connected to the first selector circuit, and a second selector circuit electrically connected to the D/A converter circuit, and
wherein digital data successively shifts through the plurality of register circuits.

12. A portable telephone comprising:
a voice input section;
a voice output section;
operation keys; and
a display device, the display device comprising:
TFTs disposed in a matrix;

a source driver; and
a gate driver,
wherein the source driver comprises a shift register circuit which includes a register circuit at a first stage, a register circuit at a second stage, . . . , a register circuit at a $(n-1)^{th}$ stage and a register circuit at a $n^{th}$ stage (wherein n stands for a natural number) and a latch circuit array which includes a first latch circuit, a second latch circuit, . . . , an $(n-1)^{th}$ latch circuit and an $n^{th}$ latch circuit,
wherein first digital data, second digital data, . . . , $(n-1)^{th}$ digital data and $n^{th}$ digital data are successively inputted to the register circuit at the first stage,
wherein output of the register circuit at the first stage, output of the register circuit at the second stage, . . . , output of the register circuit at the $(n-1)^{th}$ stage and output of the register circuit at the $n^{th}$ stage are respectively sent out to the first latch circuit, the second latch circuit, . . . , the $(n-1)^{th}$ latch circuit and the $n^{th}$ latch circuit, and
wherein when the first digital data is inputted to the register circuit at the $n^{th}$ stage, oscillation of a clock signal inputted to the shift register circuit stops, so that the $n^{th}$ digital data, the $(n-1)^{th}$ digital data, . . . , the second digital data and the first digital data which are respectively held in the register circuit at the first stage, the register circuit at the second stage, . . . , the register circuit at the $(n-1)^{th}$ stage and the register circuit at the $n^{th}$ stage are respectively taken into the first latch circuit, the second latch circuit, . . . , the $(n-1)^{th}$ latch circuit and the $n^{th}$ latch circuit.

13. The portable telephone according to claim 9, wherein the display device is a liquid crystal display device.

14. The portable telephone according to claim 10, wherein the display device is a liquid crystal display device.

15. The portable telephone according to claim 11, wherein the display device is a liquid crystal display device.

16. The portable telephone according to claim 12, wherein the display device is a liquid crystal display device.

17. A computer comprising:
a key board; and
a display device, the display device comprising:
a shift register circuit including a plurality of register circuits;
a latch circuit array including a plurality of latch circuits;
a first selector circuit electrically connected to the latch circuit array for selecting data fed from the latch circuit array;
a D/A converter circuit electrically connected to the first selector circuit; and
a second selector circuit electrically connected to the D/A converter circuit,
wherein digital data is inputted to the shift register circuit,
wherein the digital data successively shifts through the plurality of register circuits, and
wherein the shift register circuit is electrically connected to the plurality of latch circuits.

18. A computer comprising:
a key board; and
a display device, the display device comprising:
a shift register circuit including a register circuit at a first stage, a register circuit at a second stage, . . . , a register circuit at a $(n-1)^{th}$ stage and a register circuit at a $n^{th}$ stage (wherein n stands for a natural number); and
a latch circuit array including a first latch circuit, a second latch circuit, . . . , an $(n-1)^{th}$ latch circuit and an $n^{th}$ latch circuit,
wherein a first digital data, a second digital data, . . . , an $(n-1)^{th}$ digital data and an $n^{th}$ digital data are successively inputted to the register circuit at the first stage,
wherein output of the register circuit at the first stage, output of the register circuit at the second stage, . . . , output of the register circuit at the $(n-1)^{th}$ stage and output of the register circuit at the $n^{th}$ stage are respectively sent out to the first latch circuit, the second latch circuit, . . . , the $(n-1)^{th}$ latch circuit and the $n^{th}$ latch circuit, and
wherein when the first digital data is inputted to the register circuit at the $n^{th}$ stage, oscillation of a clock signal inputted to the shift register circuit stops, and the $n^{th}$ digital data, the $(n-1)^{th}$ digital data, . . . , the second digital data and the first digital data which are respectively held in the register circuit at the first stage, the register circuit at the second stage, . . . , the register circuit at the $(n-1)^{th}$ stage and the register circuit at the $n^{th}$ stage are respectively read into the first latch circuit, the second latch circuit, . . . , the $(n-1)^{th}$ latch circuit and the $n^{th}$ latch circuit.

19. A computer comprising:
a key board; and
a display device, the display device comprising:
TFTs disposed in a matrix;
a source driver; and
a gate driver,
wherein the source driver comprises a shift register circuit which includes a plurality of register circuits, a latch circuit array which includes a plurality of latch circuits and is electrically connected to the shift register circuit, a first selector circuit electrically connected to the latch circuit array for selecting data fed from the latch circuit array, a D/A converter circuit electrically connected to the first selector circuit, and a second selector circuit electrically connected to the D/A converter circuit, and
wherein digital data successively shifts through the plurality of register circuits.

20. A computer comprising:
a key board; and
a display device, the display device comprising:
TFTs disposed in a matrix;
a source driver; and
a gate driver,
wherein the source driver comprises a shift register circuit which includes a register circuit at a first stage, a register circuit at a second stage, . . . , a register circuit at a $(n-1)^{th}$ stage and a register circuit at a $n^{th}$ stage (wherein n stands for a natural number) and a latch circuit array which includes a first latch circuit, a second latch circuit, . . . , an $(n-1)^{th}$ latch circuit and an $n^{th}$ latch circuit,
wherein first digital data, second digital data, . . . , $(n-1)^{th}$ digital data and $n^{th}$ digital data are successively inputted to the register circuit at the first stage,
wherein output of the register circuit at the first stage, output of the register circuit at the second stage, . . . , output of the register circuit at the $(n-1)^{th}$ stage and output of the register circuit at the $n^{th}$ stage are respectively sent out to the first latch circuit, the second latch circuit, . . . , the $(n-1)^{th}$ latch circuit and the $n^{th}$ latch circuit, and
wherein when the first digital data is inputted to the register circuit at the $n^{th}$ stage, oscillation of a clock signal inputted to the shift register circuit stops, so that the $n^{th}$ digital data, the $(n-1)^{th}$ digital data, . . . , the second digital data and the first digital data which are respectively held in the register circuit at the first stage, the register circuit at the second stage, . . . , the register circuit at the (n−1)$^{th}$ stage and the register circuit at the n$^{th}$ stage are respectively taken into the first latch circuit, the second latch circuit, . . . , the (n−1)$^{th}$ latch circuit and the n$^{th}$ latch circuit.

21. The computer according to claim 17, wherein the display device is a liquid crystal display device.

22. The computer according to claim 18, wherein the display device is a liquid crystal display device.

23. The computer according to claim 19, wherein the display device is a liquid crystal display device.

24. The computer according to claim 20, wherein the display device is a liquid crystal display device.

25. A digital camera comprising:
an operation switch;
an image receiving section; and
a display device, the display device comprising:
a shift register circuit including a plurality of register circuits;
a latch circuit array including a plurality of latch circuits;
a first selector circuit electrically connected to the latch circuit array for selecting data fed from the latch circuit array;
a D/A converter circuit electrically connected to the first selector circuit; and
a second selector circuit electrically connected to the D/A converter circuit,
wherein digital data is inputted to the shift register circuit,
wherein the digital data successively shifts through the plurality of register circuits, and
wherein the shift register circuit is electrically connected to the plurality of latch circuits.

26. A digital camera comprising:
an operation switch;
an image receiving section; and
a display device, the display device comprising:
a shift register circuit including a register circuit at a first stage, a register circuit at a second stage, . . . , a register circuit at a (n−1)$^{th}$ stage and a register circuit at a n$^{th}$ stage (wherein n stands for a natural number); and
a latch circuit array including a first latch circuit, a second latch circuit, . . . , an (n−1)$^{th}$ latch circuit and an n$^{th}$ latch circuit,
wherein a first digital data, a second digital data, . . . , an (n−1)$^{th}$ digital data and an n$^{th}$ digital data are successively inputted to the register circuit at the first stage,
wherein output of the register circuit at the first stage, output of the register circuit at the second stage, . . . , output of the register circuit at the (n−1)$^{th}$ stage and output of the register circuit at the n$^{th}$ stage are respectively sent out to the first latch circuit, the second latch circuit, . . . , the (n−1)$^{th}$ latch circuit and the n$^{th}$ latch circuit, and
wherein when the first digital data is inputted to the register circuit at the n$^{th}$ stage, oscillation of a clock signal inputted to the shift register circuit stops, and the n$^{th}$ digital data, the (n−1)$^{th}$ digital data, . . . , the second digital data and the first digital data which are respectively held in the register circuit at the first stage, the register circuit at the second stage, . . . , the register circuit at the (n−1)$^{th}$ stage and the register circuit at the n$^{th}$ stage are respectively read into the first latch circuit, the second latch circuit, . . . , the (n−1)$^{th}$ latch circuit and the n$^{th}$ latch circuit.

27. A digital camera comprising:
an operation switch;
an image receiving section; and
a display device, the display device comprising:
TFTs disposed in a matrix;
a source driver; and
a gate driver,
wherein the source driver comprises a shift register circuit which includes a plurality of register circuits, a latch circuit array which includes a plurality of latch circuits and is electrically connected to the shift register circuit, a first selector circuit electrically connected to the latch circuit array for selecting data fed from the latch circuit array, a D/A converter circuit electrically connected to the first selector circuit, and a second selector circuit electrically connected to the D/A converter circuit, and
wherein digital data successively shifts through the plurality of register circuits.

28. A digital camera comprising:
an operation switch;
an image receiving section; and
a display device, the display device comprising:
TFTs disposed in a matrix;
a source driver; and
a gate driver,
wherein the source driver comprises a shift register circuit which includes a register circuit at a first stage, a register circuit at a second stage, . . . , a register circuit at a (n−1)$^{th}$ stage and a register circuit at a n$^{th}$ stage (wherein n stands for a natural number) and a latch circuit array which includes a first latch circuit, a second latch circuit, . . . , an (n−1)$^{th}$ latch circuit and an n$^{th}$ latch circuit,
wherein first digital data, second digital data, . . . , (n−1)$^{th}$ digital data and n$^{th}$ digital data are successively inputted to the register circuit at the first stage,
wherein output of the register circuit at the first stage, output of the register circuit at the second stage, . . . , output of the register circuit at the (n−1)$^{th}$ stage and output of the register circuit at the n$^{th}$ stage are respectively sent out to the first latch circuit, the second latch circuit, . . . , the (n−1)$^{th}$ latch circuit and the n$^{th}$ latch circuit, and
wherein when the first digital data is inputted to the register circuit at the n$^{th}$ stage, oscillation of a clock signal inputted to the shift register circuit stops, so that the n$^{th}$ digital data, the (n−1)$^{th}$ digital data, . . . , the second digital data and the first digital data which are respectively held in the register circuit at the first stage, the register circuit at the second stage, . . . , the register circuit at the (n−1)$^{th}$ stage and the register circuit at the n$^{th}$ stage are respectively taken into the first latch circuit, the second latch circuit, . . . , the (n−1)$^{th}$ latch circuit and the n$^{th}$ latch circuit.

29. The digital camera according to claim 25, wherein the display device is a liquid crystal display device.

30. The digital camera according to claim 26, wherein the display device is a liquid crystal display device.

31. The digital camera according to claim 27, wherein the display device is a liquid crystal display device.

32. The digital camera according to claim 28, wherein the display device is a liquid crystal display device.

* * * * *